US012683617B2

(12) United States Patent
    Borwick et al.

(10) Patent No.: US 12,683,617 B2
(45) Date of Patent: Jul. 14, 2026

(54) THERMALLY COMPENSATED PHYSICS PACKAGE USING TWO- VAPOR CELL TECHNIQUE FOR ATOMIC REFERENCE BASED TEMPERATURE CONTROL

(71) Applicant: Teledyne Scientific & Imaging, LLC, Thousand Oaks, CA (US)

(72) Inventors: Robert Borwick, Thousand Oaks, CA (US); Jeffrey DeNatale, Thousand Oaks, CA (US); Mu Hong Lin, Thousand Oaks, CA (US); Nicholas Kotsianas, West Sacramento, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 18/822,998

(22) Filed: Sep. 3, 2024

(65) Prior Publication Data
    US 2026/0066909 A1     Mar. 5, 2026

(51) Int. Cl.
    *H03L 7/26*        (2006.01)
(52) U.S. Cl.
    CPC .................................... *H03L 7/26* (2013.01)
(58) Field of Classification Search
    None
    See application file for complete search history.

(56) References Cited

U.S. PATENT DOCUMENTS

| | | | |
|---|---|---|---|
| 6,201,821 B1 | 3/2001 | Zhu et al. | |
| 7,902,927 B2 | 3/2011 | Davis et al. | |
| 11,543,474 B1 | 1/2023 | Schwindt et al. | |
| 2015/0180492 A1* | 6/2015 | Yoshida | H03L 7/26 |
| | | | 331/94.1 |
| 2019/0334537 A1* | 10/2019 | Zhang | G04F 5/145 |
| 2021/0109173 A1 | 4/2021 | Lee et al. | |

OTHER PUBLICATIONS

International Search Report and Written Opinion of the International Searching Authority for International Application No. PCT/US2025/041044 mailed Nov. 13, 2025.

* cited by examiner

*Primary Examiner* — Jeffrey M Shin

(74) *Attorney, Agent, or Firm* — K&L Gates LLP

(57)         ABSTRACT
A physics package includes a laser, a first vapor cell having an alkali metal vapor and a first buffer gas, a second vapor cell having the alkali metal vapor and a second buffer gas, and a photo-detector. The first and second buffer gases differ. A first and a second portion of the laser output traverse the first vapor cell and second vapor cell, respectively. The photo-detector detects a first optical transmittance and a second optical transmittance of the portions of the laser transmitted through the first vapor cell and the second vapor cell, respectively. A system includes the physics package, an output frequency generator, a microwave generator, a circuit to modulate the laser output, and a control circuit. The control circuit modulates a characteristic of the laser output and controls the frequency generator output. The system may compensate for a temperature change in the physics package.

18 Claims, 17 Drawing Sheets

THERMALLY COMPENSATED PHYSICS PACKAGE USING TWO- VAPOR CELL TECHNIQUE FOR ATOMIC REFERENCE BASED TEMPERATURE CONTROL

BACKGROUND

The subject matter described in the present disclosure relates to a physics package such as atomic frequency standards (including atomic clocks or chip-scale atomic clocks), magnetometers, or gyroscopes. The physics package may interrogate atomic states in a vapor cell that typically contains alkali species and buffer gasses. A frequency associated with a difference in energy levels of the atomic states may form a basis for a standardized output waveform of the physics package. These devices may typically include an optical source, usually a vertical cavity surface-emitting laser ("VCSEL"), conditioning optics, a vapor cell, a heating element, a vapor cell temperature measuring device, and a photodetector. The VCSEL and vapor cell may be thermally biased to stabilize their temperature over a range of external ambient conditions. Small variations in the temperature within the vapor cell may result in variations in the energy levels of the atomic states. The temperature dependent variations in the energy levels may reduce the accuracy of the output waveform. It is desirable to compensate for the variation in atomic state energies due to temperature variation.

SUMMARY

In one aspect, a thermally compensated physics package may include a laser, a first vapor cell to receive a first portion of an output of the laser, a second vapor cell to receive a second portion of the output of the laser, and a photo-detector. The first vapor cell may include an alkali metal vapor and a first buffer gas, and the second vapor cell may include the alkali metal vapor and a second buffer gas. A composition of the first buffer gas may differ from a composition of the second buffer gas. The photo-detector may detect a first optical transmittance of a first portion of the output of the laser transmitted through the first vapor cell, and detect a second optical transmittance of a second portion of the output of the laser transmitted through the second vapor cell.

In one aspect, a system may include a physics package, an output frequency generator, a microwave generator, a laser modulation circuit, and a control circuit including a processor and a memory unit. The physics package may include a laser, a first vapor cell to receive a first portion of an output of the laser, a second vapor cell to receive a second portion of the output of the laser, and a photo-detector. The first vapor cell may include an alkali metal vapor and a first buffer gas, and the second vapor cell may include the alkali metal vapor and a second buffer gas. A composition of the first buffer gas may differ from a composition of the second buffer gas. The photo-detector may detect a first optical transmittance of a first portion of the output of the laser transmitted through the first vapor cell, and detect a second optical transmittance of a second portion of the output of the laser transmitted through the second vapor cell. The memory unit of the control circuit may include instructions that, when executed by the processor, cause the processor to modulate, via the laser modulation circuit, a characteristic of the output of the laser; and control an output of the output frequency generator.

In one aspect a method to thermally compensate a physics package may include modulating an output of a laser, measuring a value of a first light transmittance of a first portion of the output of the laser transmitted through a first vapor cell, in which the first vapor cell includes an alkali metal vapor and a first buffer gas, and measuring a value of a second light transmittance of a second portion of the output of the laser transmitted through a second vapor cell, in which the second vapor cell includes the alkali metal vapor and a second buffer gas. The first buffer gas may have a temperature dependent relative change in frequency that is less than a temperature dependent relative change in frequency of the second buffer gas.

FIGURES

Various features of the embodiments described herein are set forth with particularity in the appended claims. The various embodiments, however, both as to organization and methods of operation, together with advantages thereof, may be understood in accordance with the following description taken in conjunction with the accompanying drawings as follows.

DETAILED DESCRIPTION

Figure 1A:
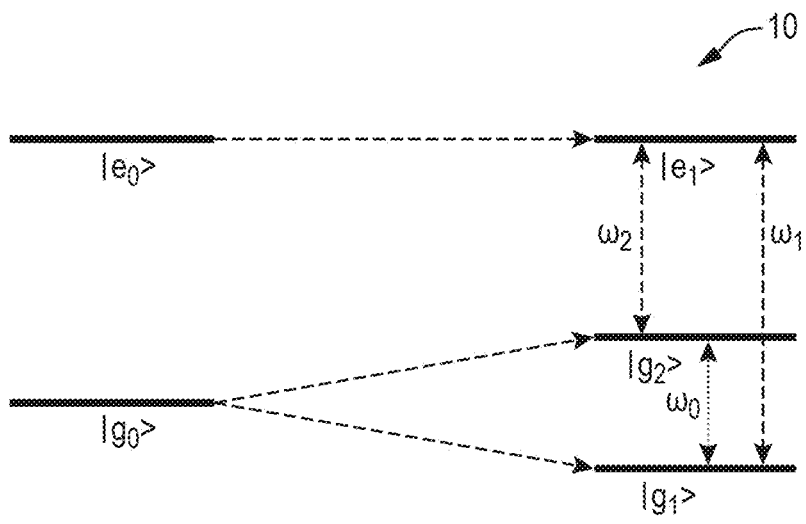
FIG. 1A is an energy level diagram of an electron according to one aspect of the present disclosure.

As discussed above, a physics package may be used in atomic frequency standards, or atomic clocks, that are capable of producing output signals with highly precise and accurate frequency characteristics. These frequency characteristics derive from well characterized splits in atomic energy levels in certain atomic species. The energy level split may be defined as a difference in energy between a lower-lying atomic energy level and a higher-lying atomic energy level. In some aspects, the energy level split may correspond to a hyperfine splitting of an unpaired electron of an alkali metal. The alkali metal may be contained in a vapor cell, where the alkali metal is heated until it vaporizes, thereby forming an alkali metal gas. The energy level split may be probed by a laser operating at frequencies corresponding to energy differences between the two atomic energy levels and an excited energy level. The discussion, below, provides a brief non-limiting description of the physics behind the use of an alkali metal in a physics package FIG. 1A illustrates an energy level diagram of an unpaired electron of an alkali metal system. The energy levels associated with the electron may include a ground state $|g_0>$ and an excited state $|e_0>$. The effect of the magnetic field of the alkali atom nucleus may result in a splitting of the energy levels according to hyperfine splitting interactions. The ground state $|g_0>$ may be split into two levels, $|g_1>$ and $|g_2>$ separated by an energy characterized by a frequency of $\omega_0$. Energy level $|e_0>$ may also be split into a manifold $|e_1>$. The energy difference between $|g_1>$ and $|e_1>$ may be characterized by a frequency $\omega_1$, and the energy difference between $|g_2>$ and $|e_1>$ may be characterized by a frequency $\omega_2$. Such frequencies $\omega_1$ and $\omega_2$ may be considered resonance frequencies of the alkali metal system. Energy input into the alkali metal system may promote an electron from $|g_1>$ to $|e_1>$ if the energy has a frequency about $\omega_1$. Similarly, energy input into the alkali metal system may promote an electron from $|g_2>$ to $|e_1>$ if the energy has a frequency about $\omega_2$. In many physics packages, the frequency $\omega_0$ may form the basis of a highly accuracy atomic clock. As illustrated in FIG. 1A, frequency $\omega_0$ is equal to the difference between $\omega_1$ and $\omega_2$. Therefore, if an alkali metal system receives energy input at both frequencies $\omega_1$ and $\omega_2$, electrons in the system will transition between $|g_1>$ and $|e_1>$ and $|g_2>$ and $|e_1>$, and the frequency $\omega_0$ may be determined from the difference between the light components corresponding to $\omega_1$ and $\omega_2$.

Figure 1B:
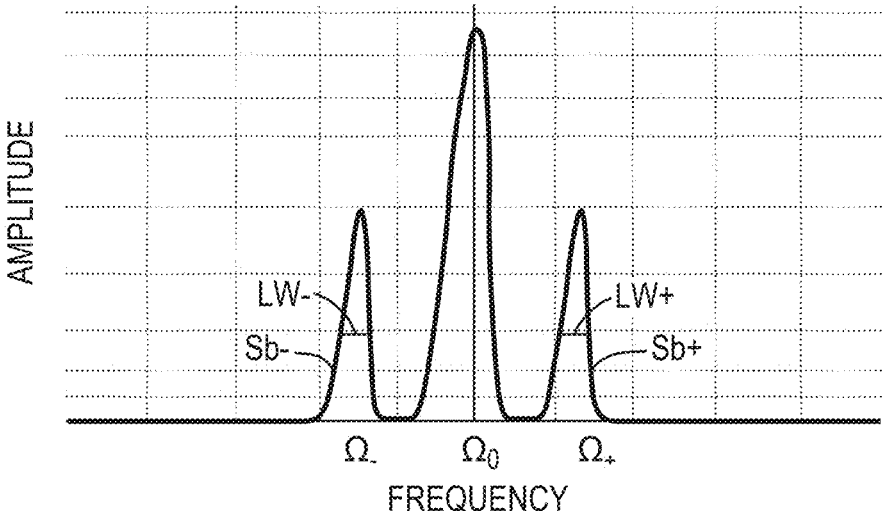
FIG. 1B is a graph of a modulated laser output according to one aspect of the present disclosure.
Figure 1C:
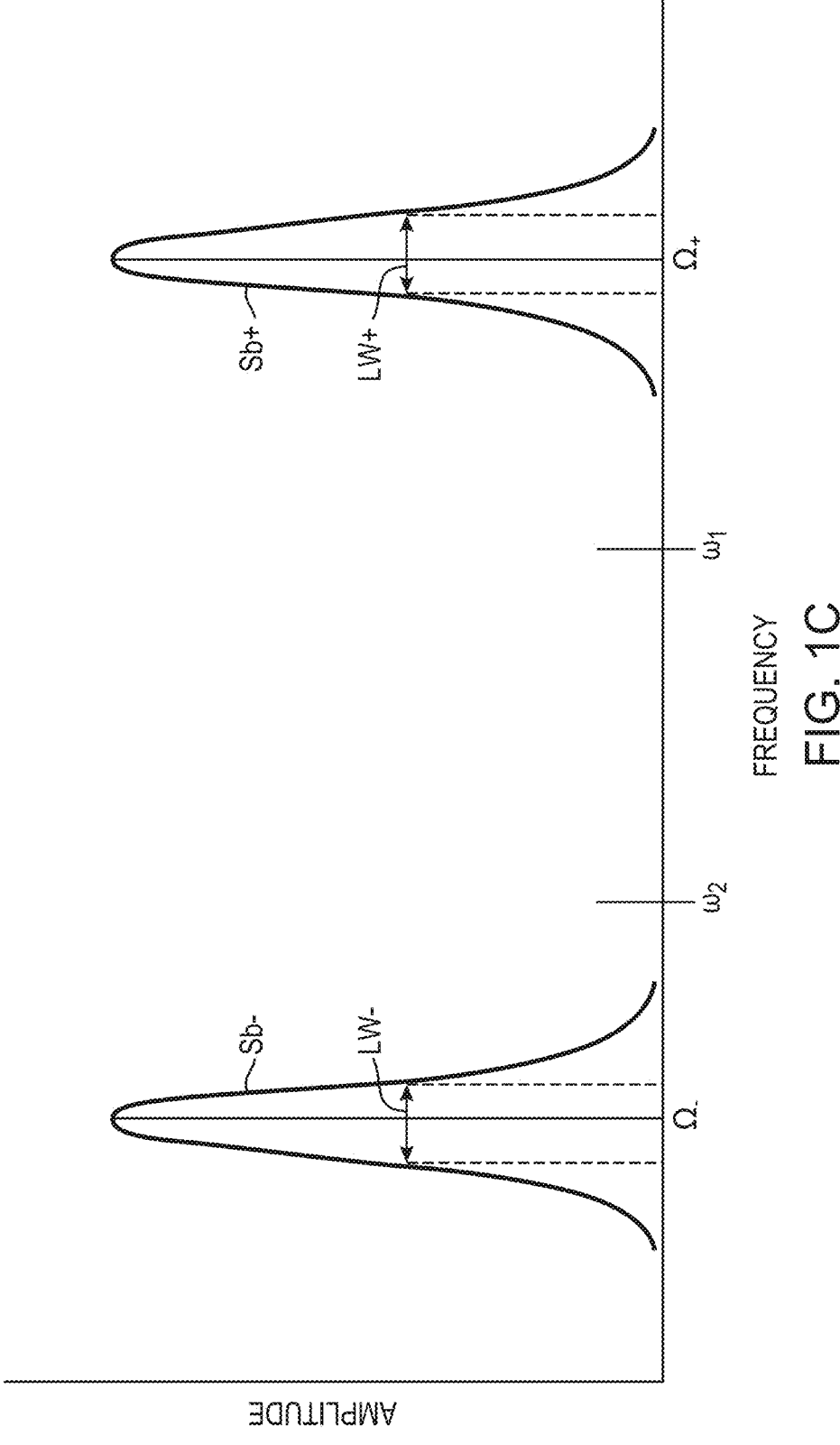
FIGS. 1C-1G are graphs illustrating changes in a modulated laser's sideband frequencies according to one aspect of the present disclosure.

FIG. 1B illustrates a graph of a laser having a base frequency of $\Omega_0$ being modulated by some frequency $\delta\Omega$. It is well known that multiplying a first signal having a first frequency by a second signal having a second frequency, will result in two signals having a sum of the two frequencies (sideband Sb+ having a linewidth LW+) and a difference of the two frequencies (sideband SB− having a linewidth LW−). Thus, modulating a laser having a base frequency of $\Omega_0$ by a frequency $\delta\Omega$ will result in two beams, one characterized by a frequency $\Omega_-$ (that is $\Omega_0-\delta\Omega$ at sideband Sb−) and a frequency $\Omega_+$ (that is $\Omega_0+\delta\Omega$ at sideband Sb+). It may therefore be understood that a laser modulation signal may be used to provide laser outputs capable of causing electron transitions between $|g_1>$ and $|e_1>$ (at frequency $\omega_1$) and $|g_2>$ and $|e_1>$ (at frequency $\omega_2$).

Returning to FIG. 1A, it has already been disclosed that radiation having a frequency at $\omega_1$ may be absorbed by an electron at energy level $|g_1>$ and it may be promoted to energy level $|e_1>$. Similarly, radiation having a frequency at $\omega_2$ may be absorbed by an electron at energy level $|g_2>$ and it may be promoted to energy level $|e_1>$. Light having frequencies at $\omega_1$ and $\omega_2$ may be absorbed by the alkali metal system, leading to a decrease in transmitted light as long as there are electrons populating the $|g_1>$ and $|g_2>$ levels. Once all of the electrons are promoted to the $|e_1>$ level (population inversion), no further light may be absorbed. This phenomenon is frequently called Coherent Population Trapping. Consequently, increasing the power of the light at frequencies $\omega_1$ and $\omega_2$ beyond the point of population inversion will increase the amount of light transmitted through the alkali metal system.

Returning now to FIG. 1B, it is noted that the optical sidebands Sb−, Sb+ are each characterized by a linewidth LW−, LW+, respectively. The maximum frequencies of Sb− and Sb+ ($\Omega_-$ and $\Omega_+$, respectively) may not be precisely equal to $\omega_2$ and $\omega_1$, respectively. However, if $\Omega_-$ is sufficiently close to $\omega_2$, there may be some frequency component within LW− that corresponds to $\omega_2$. Similarly, if $\Omega_+$ is sufficiently close to $\omega_1$, there may be some frequency component within LW+ that corresponds to $\omega_1$. The amount of power at frequencies $\omega_1$ and $\omega_2$ may result in some fraction of the electrons to be promoted from their respective ground states ($|g_1>$ and $|g_2>$) to excited state $|e_1>$. Initially, the electrons are in the ground states ($|g_1>$ and $|g_2>$). As a change in the modulation frequency $\delta\Omega$ causes frequencies $\Omega_-$ and $\Omega_+$ to approach the frequencies $\omega_2$ and $\omega_1$, respectively, electrons are promoted from the ground states ($|g_1>$ and $|g_2>$) to excited state $|e_1>$ based on the respective line-widths LW− and LW+. This may result in light at those frequencies being absorbed by the alkali metal atoms. At sufficient power—when $\Omega_-$ and $\Omega_+$ are effectively close to $\omega_2$ and $\omega_1$, respectively—all of the atoms are promoted to excited state $|e_1>$ and no further light can be absorbed.

Figure 1D:
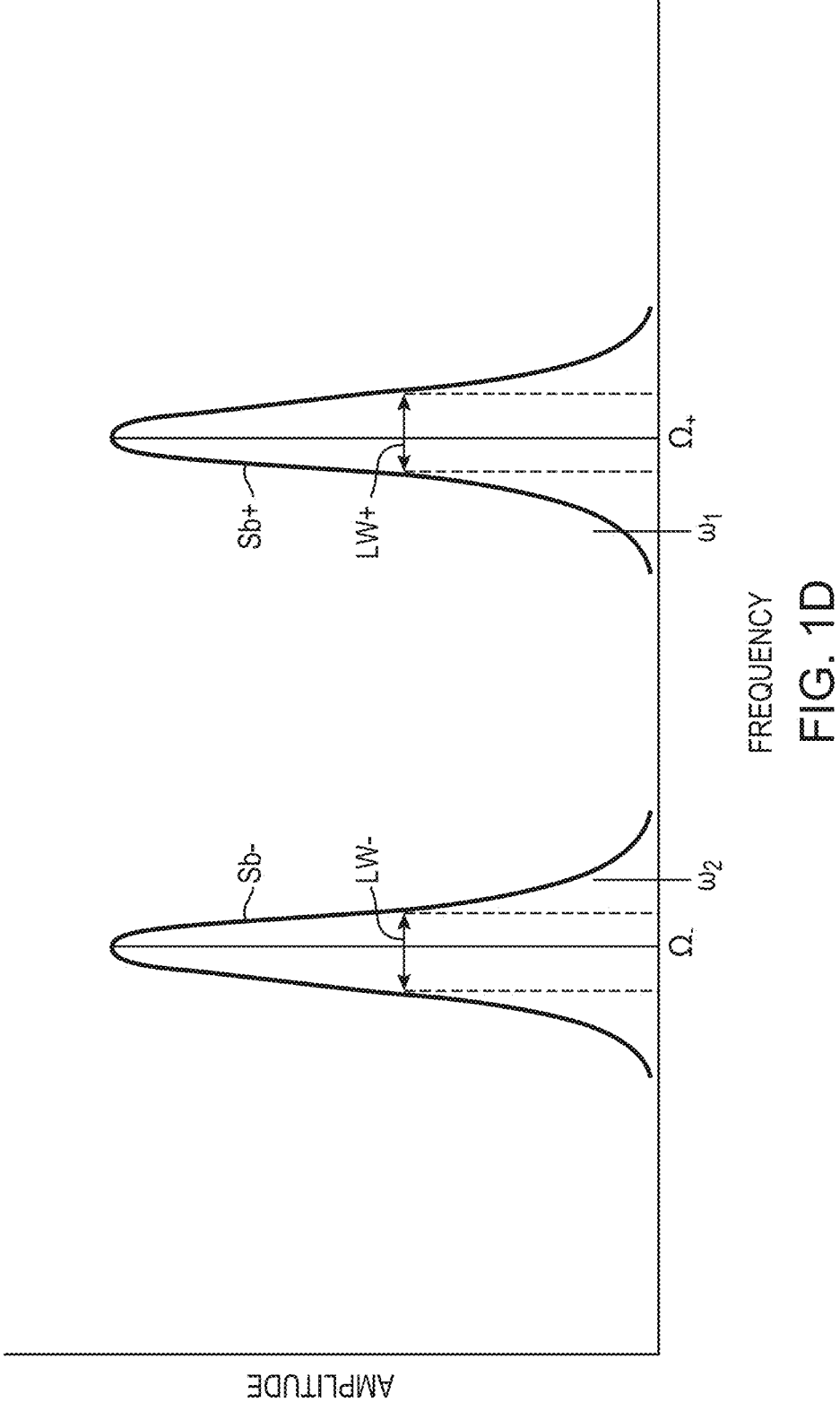
Figure 1E:
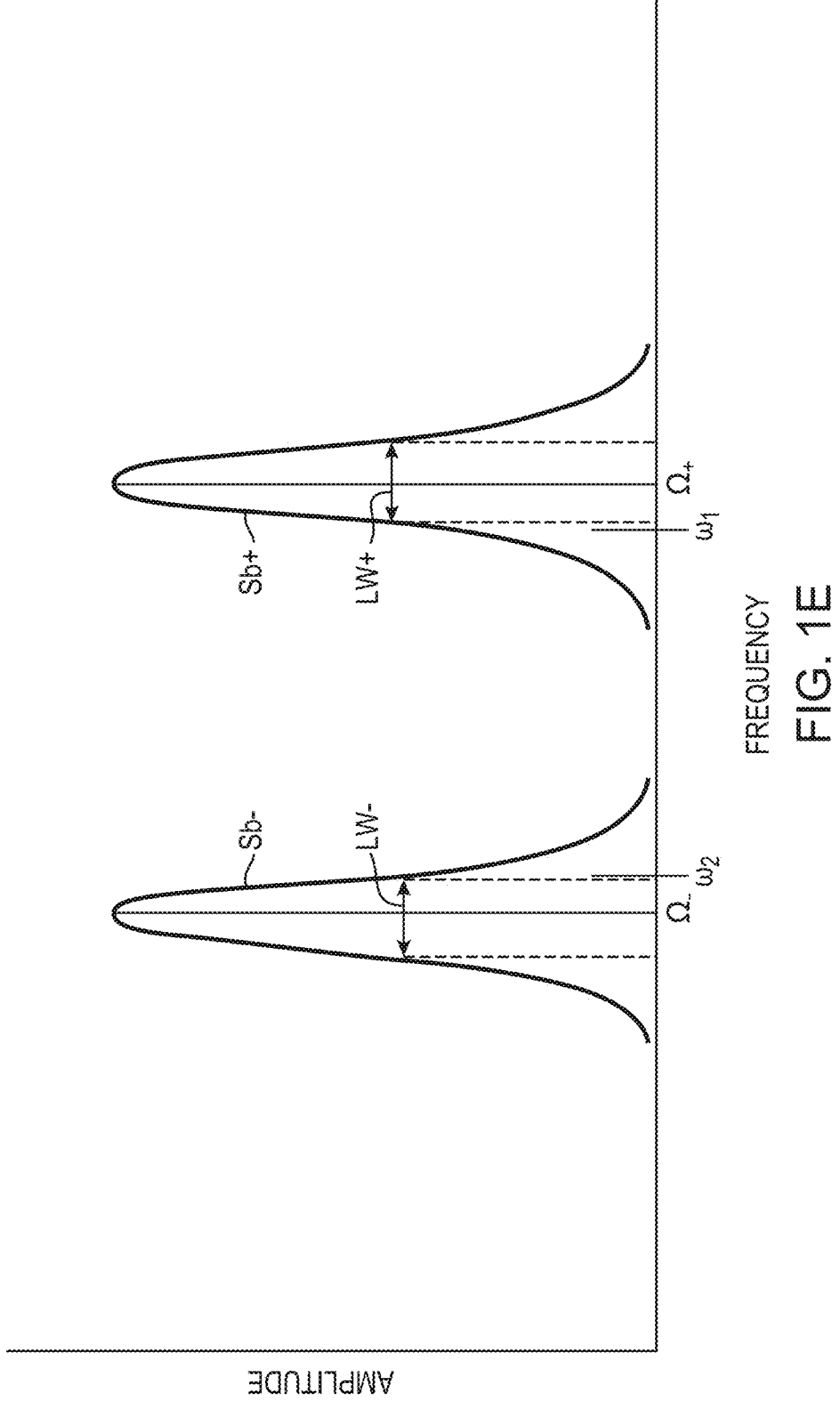
Figure 1F:
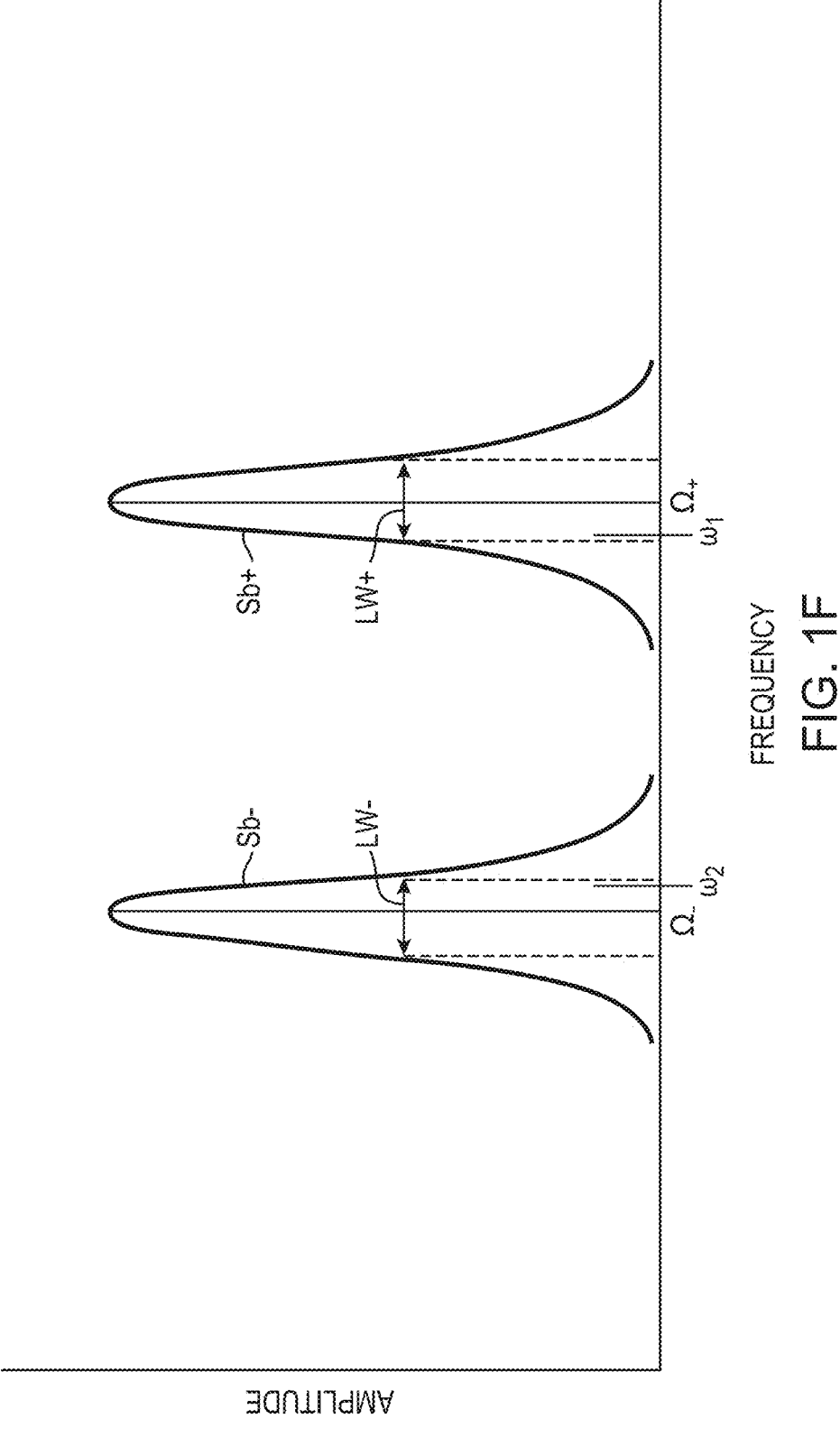
Figure 1G:
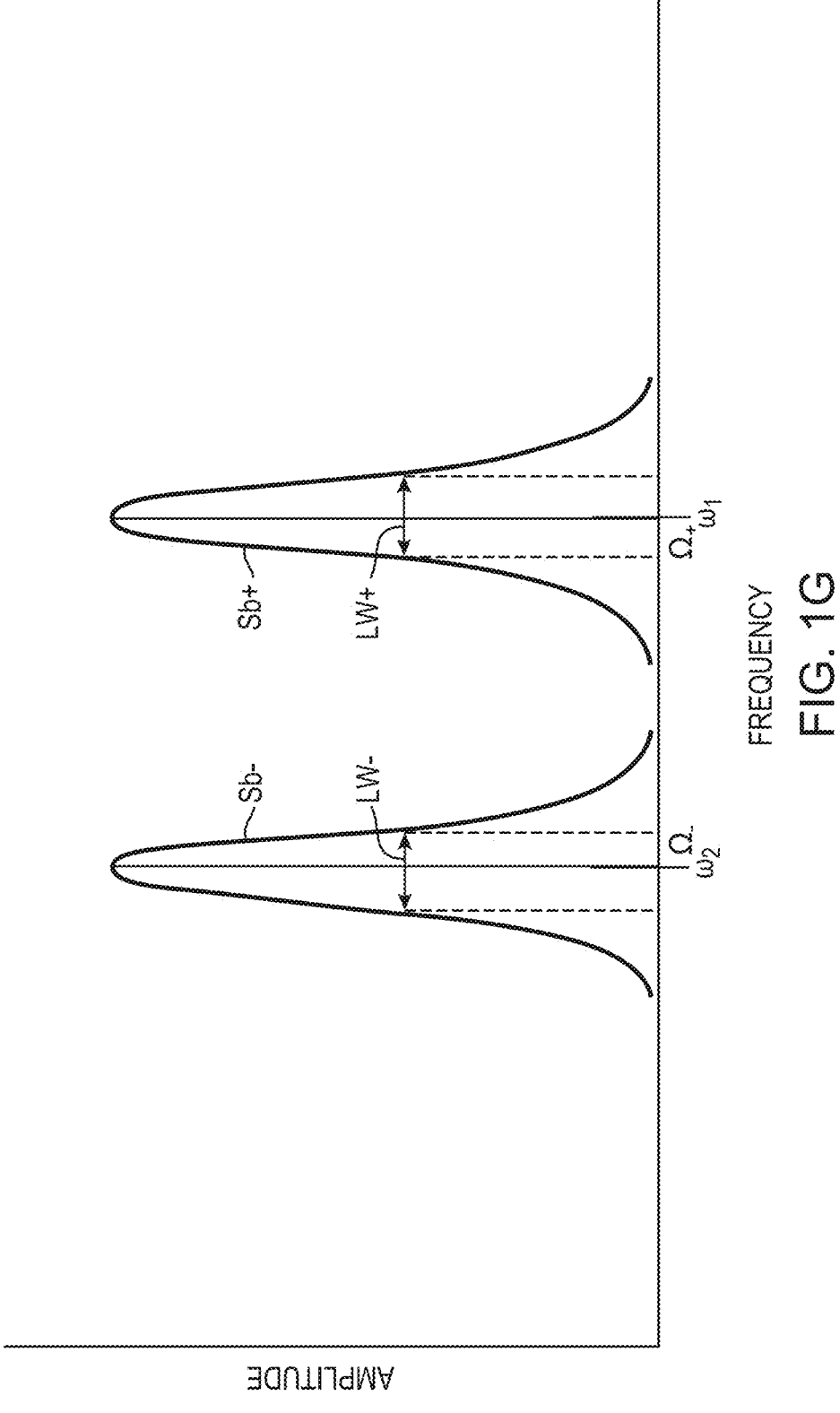
Figure 1H:
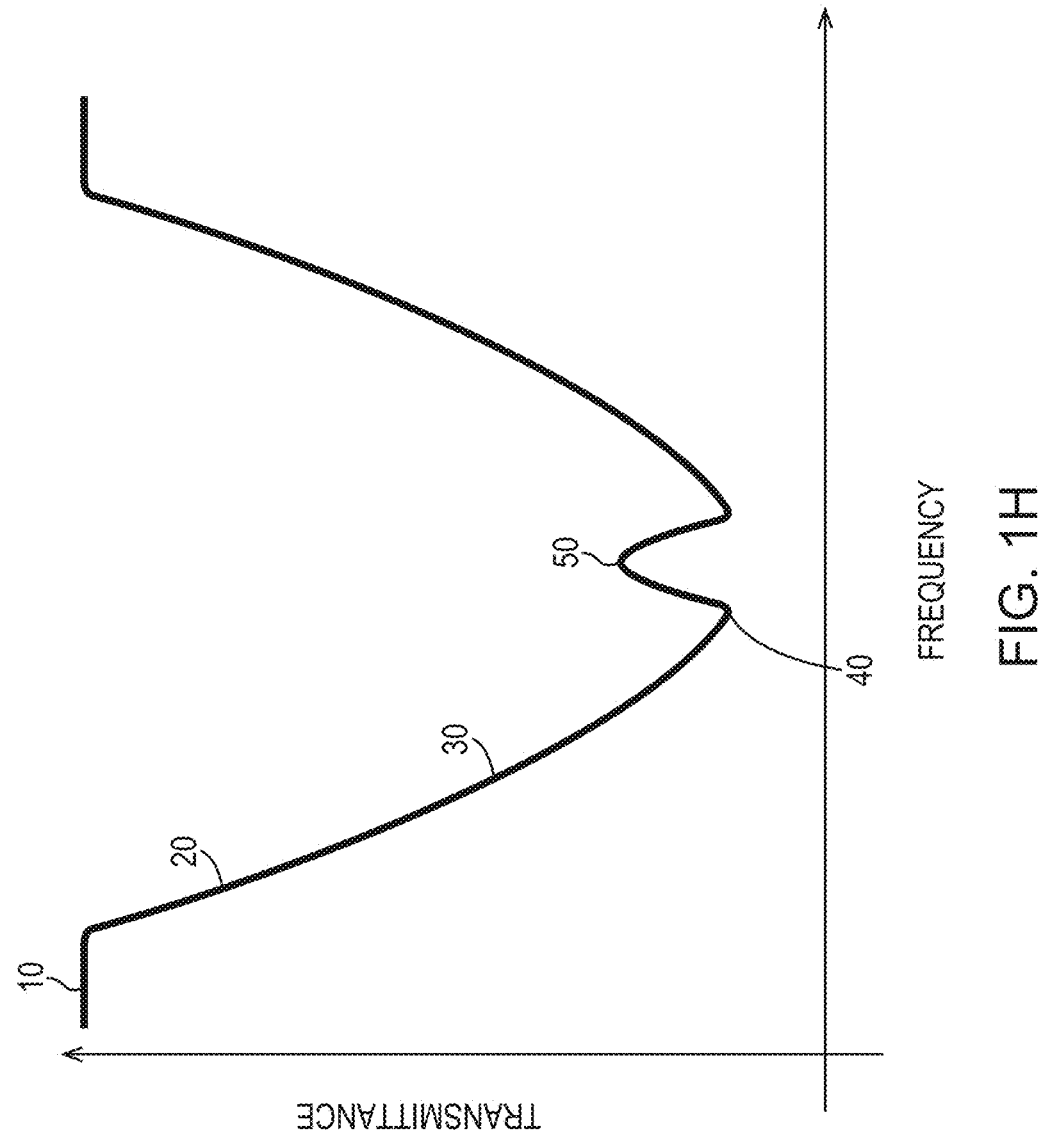
FIG. 1H is a graph illustrating the coherent population trapping (CPT) effect according to one aspect of the present disclosure.

FIGS. 1C-1G illustrate how laser sideband frequencies $\Omega_-$ and $\Omega_+$ may be changed to become close to the alkali metal system resonant frequencies $\omega_2$ and $\omega_1$, respectively. FIG. 1H illustrates a transmittance graph of the laser transmitted through an alkali metal system as the sideband modulations are changed. Thus, in FIG. 1C, the maximum frequencies $\Omega_-$ and $\Omega_+$ of the sidebands are sufficiently distant from the resonant frequencies $\omega_2$ and $\omega_1$, respectively, that no light is absorbed (see 10 at FIG. 1H). FIGS. 1D and 1E illustrate that as sideband frequencies $\Omega_-$ and $\Omega_+$ approach $\omega_2$ and $\omega_1$, respectively, some amount of power within the respective line-widths is absorbed, leading to a decrease in transmittance of light through the alkali metal system (see 20 and 30 at FIG. 1H). FIG. 1F illustrates $\Omega_-$ and $\Omega_+$ sufficiently close to $\omega_2$ and $\omega_1$, respectively, so that maximum absorbance occurs, and population inversion is attained (see 40 at FIG. 1H). FIG. 1G illustrates laser sideband frequencies $\Omega_-$ and $\Omega_+$ essentially equal to $\omega_2$ and $\omega_1$, respectively. Under this condition, additional laser light is not absorbed, and a slight increase in transmittance is observable as an extremum in the transmittance curve (see 50 at FIG. 1H). Therefore, by looking for an extremum in the laser transmittance through the alkali metal system, one may determine when the laser modulation produces sidebands having frequencies essentially equal to the resonance frequencies of the alkali metal system.

In addition to an alkali metal vapor, the vapor cells may incorporate buffer gases. The buffer gases may help reduce collisions between alkali metal atoms or between the alkali metal atoms the walls of the vapor cell. However, thermal energy may be transferred from the buffer gases to the alkali metal. The effect of thermal energy transference from a buffer gas to the alkali metal may be dependent on characteristics of the buffer gas. In some aspects, a mixture of buffer gases may be used to control the total effect of energy transference form each buffer gas to the alkali metal. Such thermal energy transfer may alter the energy levels of the alkali metal being probed by the laser, resulting in changes to the frequency (see $\omega_0$, FIG. 1A) defining the ground state energy level spit of the alkali metal unpaired electron. Therefore, it may be critical that the temperature of the vapor cell be kept constant over time.

For large-scale physics packages, typically housed in environmentally controlled enclosures, such temperature control may be adequately maintained by thermal elements to control the temperature of the vapor cell. However, for smaller physics packages (such as chip-scale atomic clocks having exemplary dimensions of about 40 mm by about 40 mm by about 12 mm) designed for portability to less controlled environments, the thermal elements of the physics packages may not be sufficient to accurately measure the temperature of the contents of a small vapor cell.

As disclosed above, the frequency ($\omega_0$) defining the energy level spit of the alkali metal unpaired electron may be affected by thermal exchange with the buffer gas in a vapor cell. Thus, a measurement of a change in the frequency ($\omega_0$) may provide an indication of the temperature of the vaporized alkali metal and buffer gas.

A relative temperature dependent difference in the ground state frequency ($\omega_0$) split of the alkali metal may be represented by $\Delta f/f$, where f is the frequency ($\omega_0$) without temperature perturbation, and $\Delta f$ is a difference between a thermally unperturbed frequency and a measured frequency under temperature perturbation. Because the thermal perturbation may be a function of thermal energy transfer from the buffer gas to the alkali metal, a temperature dependence of $\Delta f/f$ may be a characterized property of the buffer gas. At present, the temperature dependence of $\Delta f/f$ (a temperature dependent relative change in frequency or "tempco") of some physics packages may be on the order of about $3.8 \times 10^{-12}$/K over a temperature range of about $-10°$ C. to about $70°$ C. In some applications, it may be desirable to compensate for the tempco of the physics package by up to two orders of magnitude over a temperature range from about $-40°$ C. to about $85°$ C. for improved accuracy in timekeeping. The present disclosure presents a device and a system for compensating the measured resonance frequency under temperature perturbation for small thermal changes in the physics package vapor cell.

Figure 2:
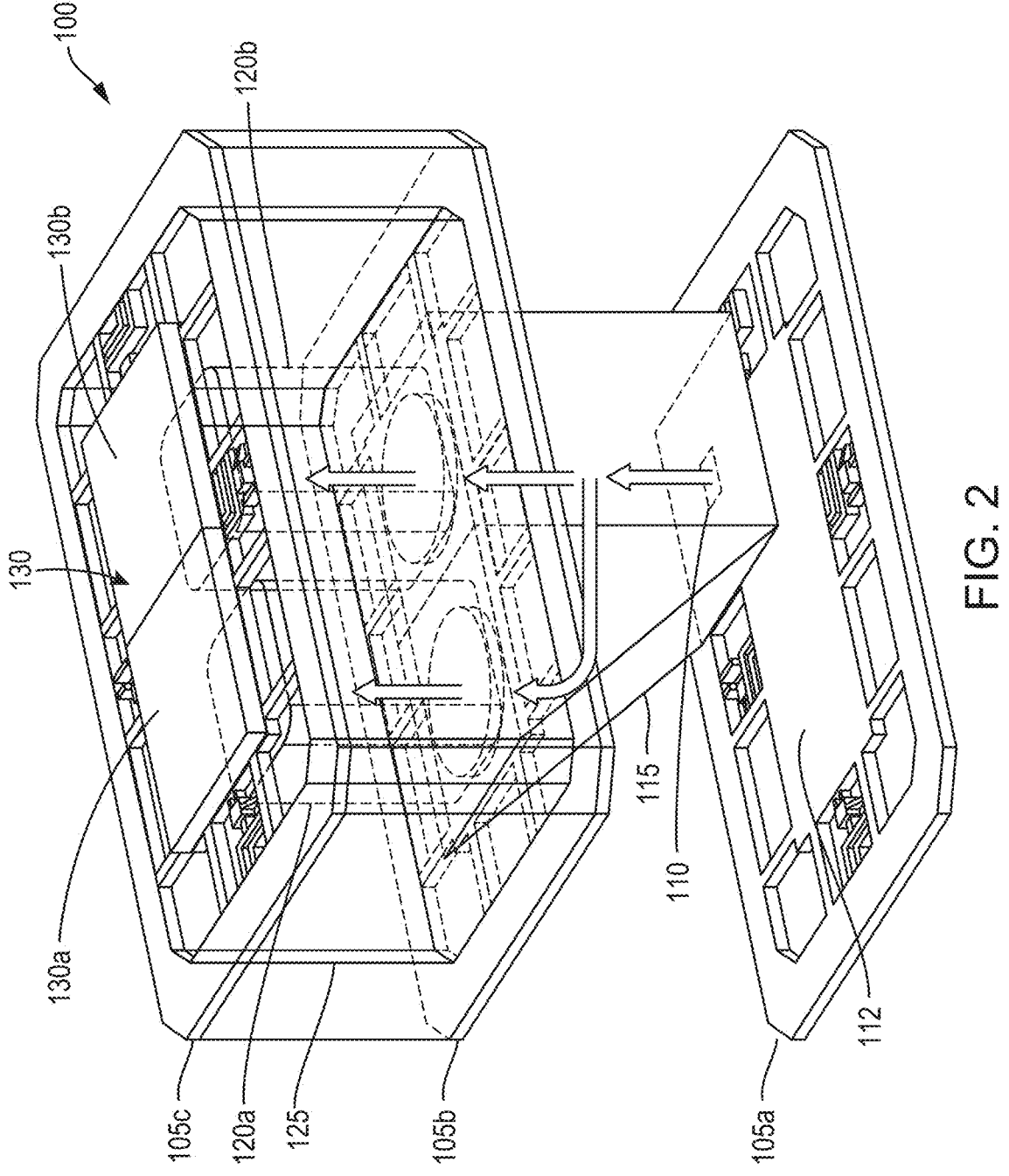
FIG. 2 is a perspective view of one aspect of an optical assembly of a physics package according to the present disclosure.

FIG. 2 depicts an optical assembly 100 of a chip-scale physics package. Optical assembly 100 comprises multiple optical components along with support structures therefor. A first suspension 105a may support an electronic base 112 on which may be mounted a laser 110, such as a VCSEL, having a laser output. In some aspects, laser 110 may be optically coupled to an optical steering device 115, which may split an output of the laser 110 into a first portion of the laser output and a second portion of the laser output. Each of the first portion of the laser output and the second portion of the laser output may be directed into one of a pair of vapor cells including first vapor cell 120a and second vapor cell 120b. First vapor cell 120a and second vapor cell 120b may be in thermal communication with each other. Vapor cells 120a,b may be mechanically supported by a second suspension 105b. In some aspects, vapor cells 120a,b may be surrounded by a magnetic field coil 125. Vapor cells 120a,b may be secured by a combination of a third suspension 105c and second suspension 105b. Third suspension 105c may also support a photo-detector 130. Photo-detector 130 may be composed of a first photo-sensor 130a and a second photo-sensor 130b.

Figure 3A:
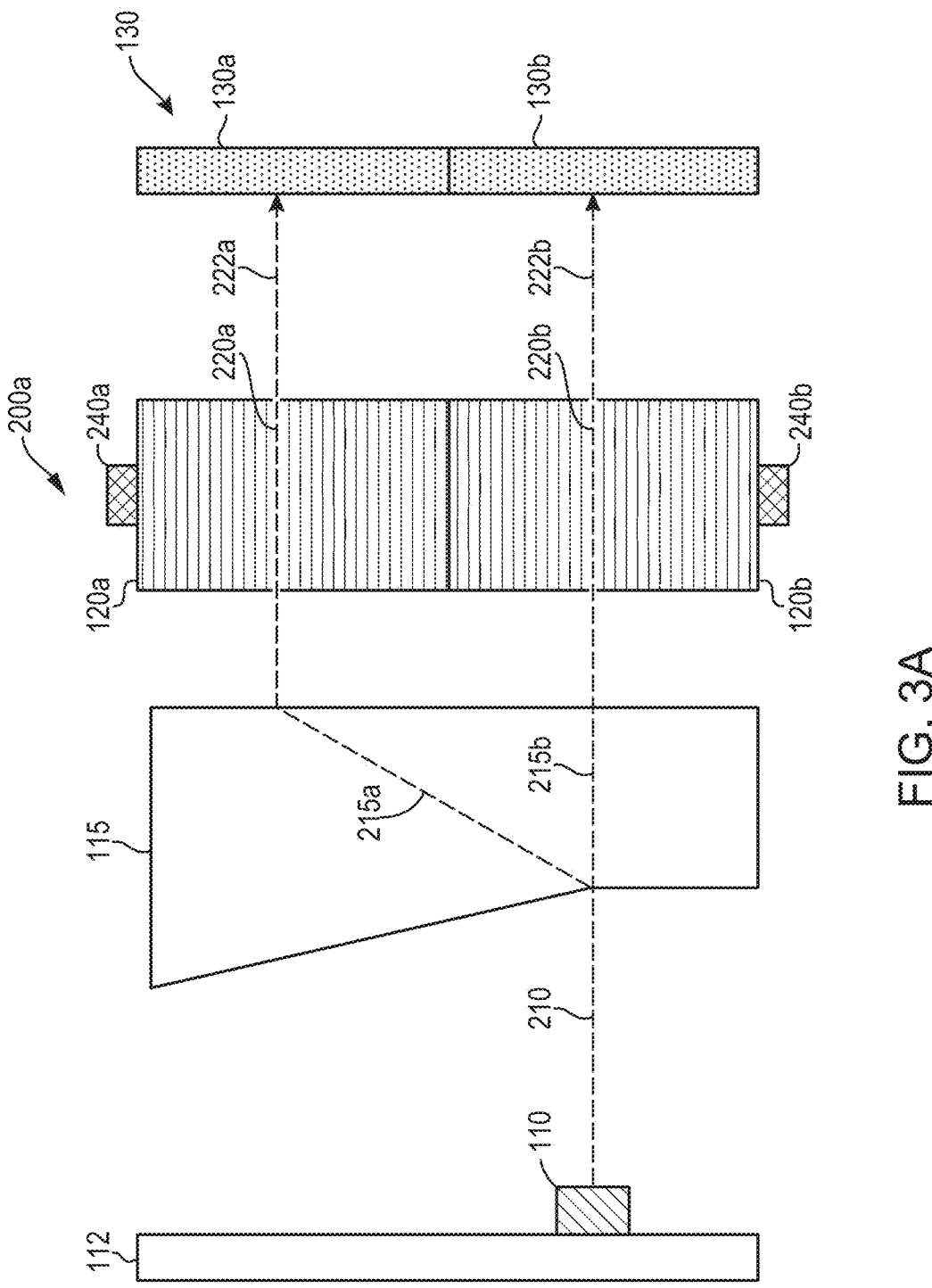
FIG. 3A is a detailed block diagram of a first set of optical components of the optical assembly illustrated in FIG. 2 according to the present disclosure.

FIG. 3A illustrates in more detail optical components 200a illustrated in optical assembly 100 depicted in FIG. 2. Laser 110 may be mounted on or otherwise supported by electronic base 112. Electronic base 112 may include electronic components (not shown) to operate and control laser 110. Laser 110 may receive an input signal from a laser modulation circuit to control an amplitude and sideband frequencies of an optical output 210 of laser 100. The sideband frequencies $\Omega_-$, and $\Phi_+$ of optical output 210 of laser 100 may correspond to frequencies $\omega_1$ and $\omega_2$ of the alkali metal species in vapor cells 120a,b as discussed above with respect to FIGS. 1A-1G.

Output 210 of laser 110 may be transmitted through optical steering device 115. In some aspects, optical steering device 115 may be a beam splitter that may separate optical output 210 of laser 110 into a first portion of the laser output 215a and second portion of the laser output 215b. First portion of the laser output 215a may be directed through first vapor cell 120a, and second portion of the laser output 215b may be directed through second vapor cell 120b. As observed in FIG. 3A, optical steering device 115 may create first portion of the laser output 215a and second portion of the laser output 215b simultaneously from optical output 210 of laser 110. In some aspects, first vapor cell 120a and second vapor cell 120b may be disposed within a heating chamber (not shown).

In some non-limiting exemplary aspects, each vapor cell, 120a and 120b, may have non-limiting dimensions of about 4 mm by 4 mm on the face and about 3 mm in length. First vapor cell 120a and second vapor cell 120b may each be filled with a combination of an alkali metal vapor and a buffer gas. In particular, first vapor cell 120a may be filled with an alkali metal vapor and a first buffer gas, and second vapor cell 120b may be filled with an alkali metal vapor and a second buffer gas. Each of first vapor cell 120a and second vapor cell 120b may contain an amount of the same alkali metal vapor. Non-limiting examples of such alkali metal vapor may include rubidium vapor or cesium vapor.

In some aspects, a composition of the first buffer gas may be different from a composition of the second buffer gas. In some aspects, the first buffer gas may be composed of a combination of a first component gas and a second component gas. In some aspects, the first component gas may be a noble gas. An exemplary noble gas may be argon, although other noble gases, such as helium, neon, krypton, or xenon, may be used alone or in combination. A second component of the first buffer gas may include other gases, including molecular gases. Non-limiting examples of molecular gases may include nitrogen and methane. In some non-limiting examples, the first buffer gas may include argon and nitrogen, or argon and methane. It may be recognized that the first buffer gas may include more than two components, such as a second noble gas or other alternative gases. In some non-limiting examples, the first buffer gas may include a combination of argon, neon, and nitrogen or a combination of argon, neon, and methane.

In some aspects, the second buffer gas may be composed of multiple gases or a single species of gas. For example, second buffer gas may be composed of only a molecular gas such as nitrogen or methane. However, it may be recognized that the second buffer gas may have the same components as the first buffer gas, but a ratio of the components in the second buffer gas may differ from a ratio of the components in the first buffer gas. It may be understood that the tempco of the first buffer gas may differ from the tempco of the second buffer gas due to a difference in composition between the first buffer gas and the second buffer gas. For example, a tempco of the first buffer gas may be less than a tempco of the second buffer gas. The effect of buffer gas composition on the tempco is illustrated in FIGS. 4A, 4B, 5A, and 5B and discussed further below.

First vapor cell 120a may be in thermal communication with second vapor cell 120b. In some aspects, there may be one or more temperature sensors 240a,b associated with vapor cells 120a,b. In some aspects, there may be a single temperature sensor in thermal communication with either vapor cell 120a or vapor cell 120b or in thermal communication with both vapor cell 120a and vapor cell 120b. In other aspects, there may be a first temperature sensor 240a in thermal communication with first vapor cell 120a and a second temperature sensor 240b in thermal communication with second vapor cell 120b. It may be recognized that the temperature measurements of vapor cells 120a,b obtained from the temperature sensors 240a,b may not accurately reflect the temperature of the contents of vapor cells 120a,b, but merely of the respective vapor cell housings. Therefore, as disclosed herein, a system and method to more accurately asses the temperature of the contents of vapor cells 120a,b may be desired.

Returning to FIG. 3A, first portion of laser output 215a and second portion of laser output 215b may be directed through first vapor cell 120a and second vapor cell 120b, respectively. When the first portion and the second portion of the laser outputs are transmitted through their respective vapor cells, an amount of laser light is absorbed by the gases in the respective vapor cells. Specifically, the contents of first vapor cell 120a, including the first buffer gas, may absorb 220a a first amount of first portion of the laser output 215a. Similarly, the contents of second vapor cell 120b, including the second buffer gas, may absorb 220b a second amount of second portion of the laser output 215b. A first optical transmittance 222a of light transmitted through from first vapor cell 120a may be detected by photo-detector 130 at first photo-sensor 130s. Similarly, a second optical transmittance 222b of light transmitted through second vapor cell 120b may be detected by photo-detector 130 at second photo-sensor 130b.

Figure 3B:
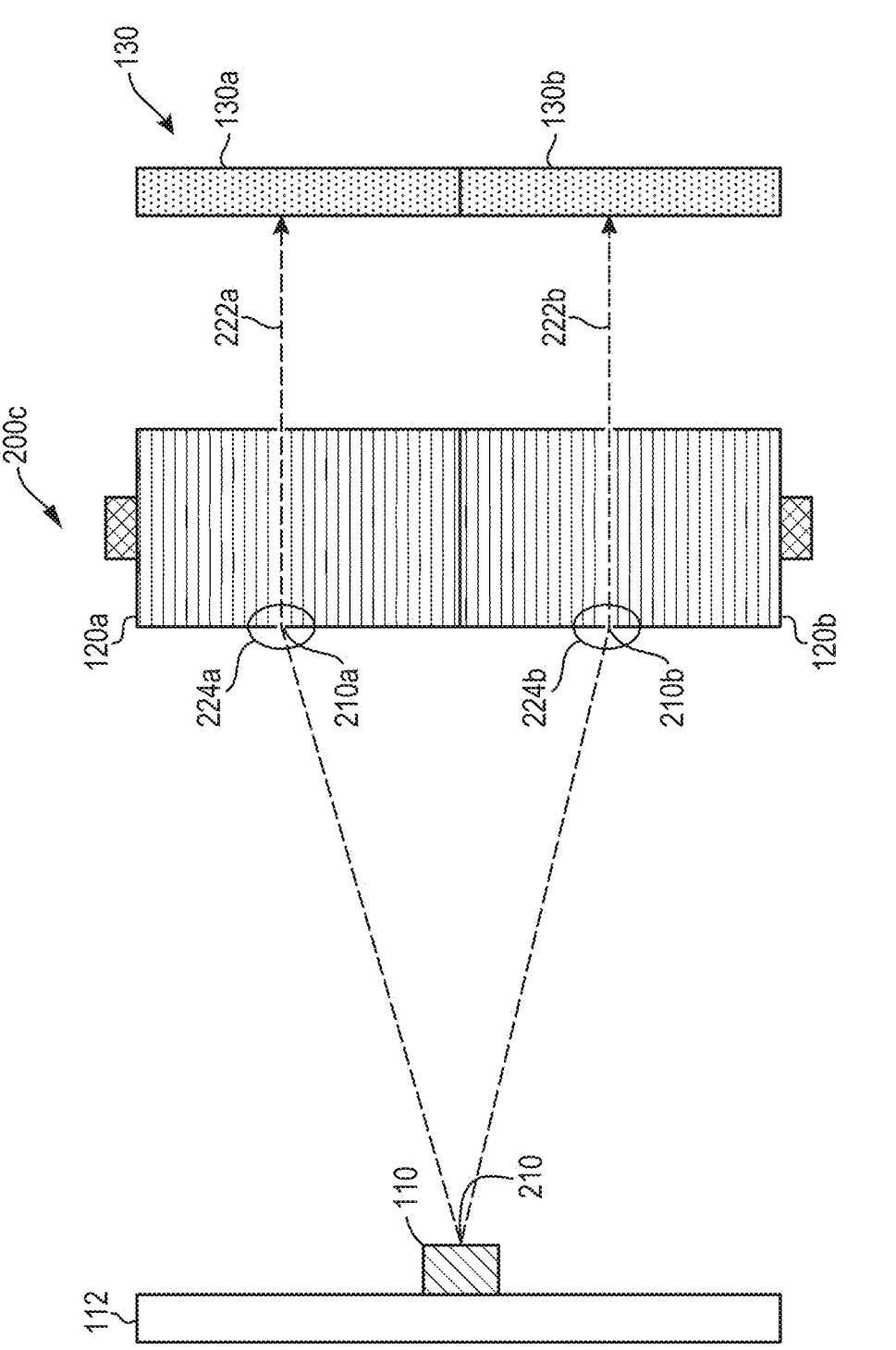
FIG. 3B is a detailed block diagram of a second set of optical components of the optical assembly illustrated in FIG. 2 according to the present disclosure.

FIG. 3B illustrates an alternative aspect of the optical components 200c illustrated in FIG. 2. It may be noted that optical steering device 115 depicted in FIG. 3A and optical steering device 115a depicted in 3B are not present in the alternative aspect of the optical components 200c. Instead, the natural divergence of optical output 210 may be relied upon to direct a first portion 210a of optical output 210 into first vapor cell 120a and a second portion 210b of optical output 210 into second vapor cell 120b. First vapor cell 120a and second vapor cell 120b may be oriented along the fast axis of laser 110 at a distance sufficient to cause optical output 210 to diverge and enter first vapor cell 120a and second vapor cell 120b. First vapor cell 120a and second vapor cell 120b may each have an optical portal (224a and 224b, respectively) to direct a first portion of optical output 210a through first vapor cell 120a and a second portion of optical output 210b through second vapor cell 120b. As discussed above with respect to FIG. 3A, light transmitted 222a through first vapor cell 120a may be detected by photo-detector 130 at first photo-sensor 130a. Similarly, light transmitted 222b through second vapor cell 120b may be detected by photo-detector 130 at second photo-sensor 130b. Optical portals 224a,b may be composed of any one or more optical elements—such as, without limitation, lenses, collimators, and filters—that may direct first portion of optical output 210a and second portion of optical output

210b through respective first and second vapor cells 120a,b to impinge on respective first and second photo-sensors 130a,b.

Figure 3C:
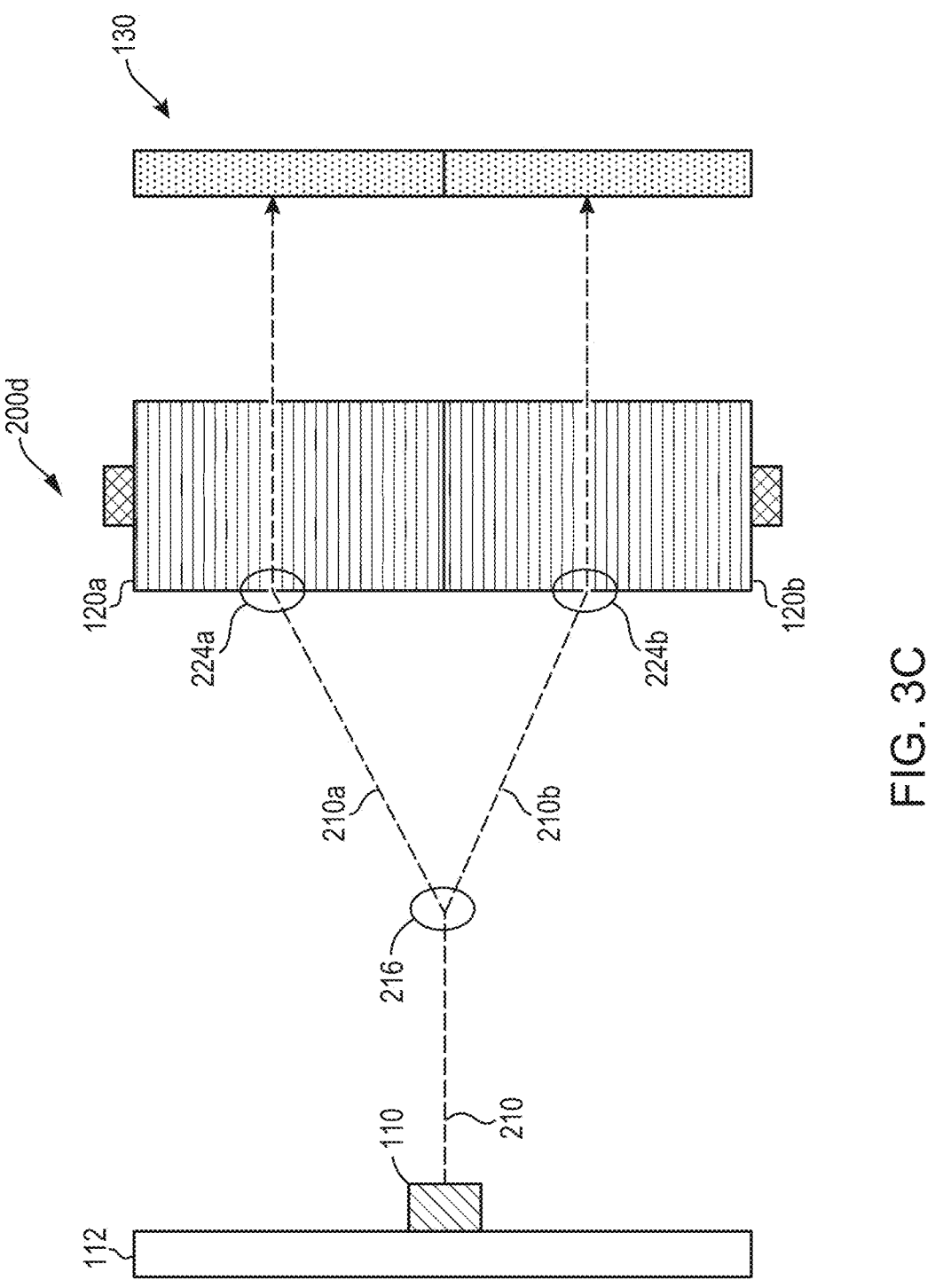
FIG. 3C is a detailed block diagram of a third set of optical components of the optical assembly illustrated in FIG. 2 according to the present disclosure.

FIG. 3C illustrates an alternative aspect of the optical components 200d illustrated in FIG. 2. FIG. 3C is similar to FIG. 3B except that an additional optical beam spreading element 216 may be added between laser 110 and first and second vapor cells 120a and 120b, respectively. This configuration may be considered for aspects in which the distance between laser 110 and first and second vapor cells 120a and 120b, respectively, is too short to permit the natural divergence of optical output 210 to enter directly first vapor cell 120a and second vapor cell 120b. Optical beam spreading element 216 may be composed of one or more non-limiting optical components such as lenses, filters, pin-holes, collimators, and similar.

Figures 4A, 4B:
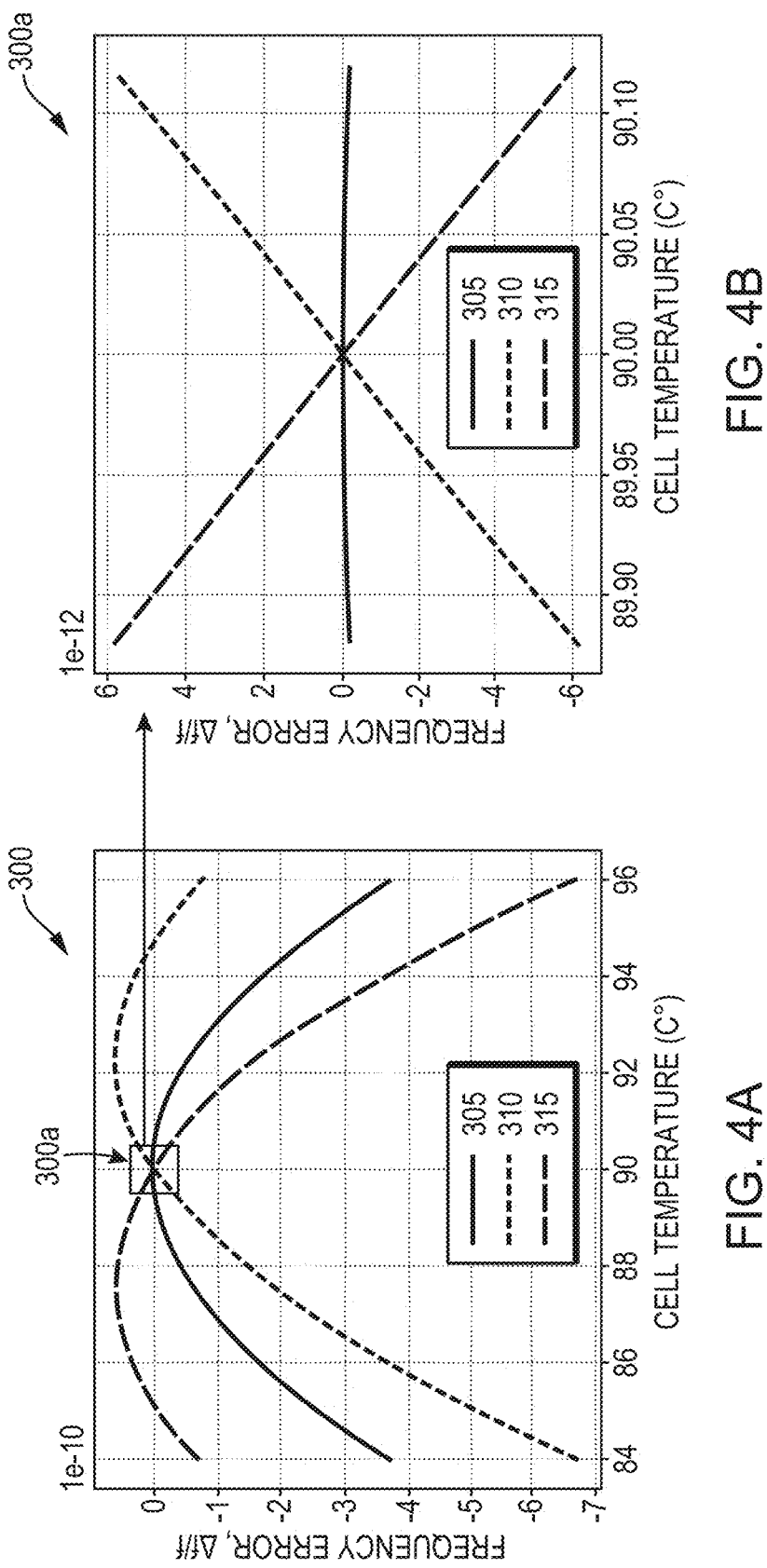
FIG. 4A is a graph of one aspect of frequency error versus vapor cell temperature as a function of vapor cell filling composition according to the present disclosure.
FIG. 4B is an expanded graph of a portion of the graph illustrated in FIG. 4A according to the present disclosure.

As disclosed above, the tempco of the buffer gases may be dependent, at least in part, on the composition of the buffer gas contained in the vapor cells. FIGS. 4A and 4B illustrate this phenomenon. FIG. 4A illustrates a graph 300 of the temperature dependent relative change in frequency ($\Delta f/f$) versus temperature for three mixtures of buffer gases over a wide temperature range (from about 84° C. to about 96° C.). Curve 305 illustrates the temperature dependent relative change in frequency ($\Delta f/f$) for a vapor cell containing a buffer gas having about 57.4% argon (the rest being nitrogen). Curve 310 illustrates the temperature dependent relative change in frequency ($\Delta f/f$) for a vapor cell containing a buffer gas having about 0.5% less argon (that is, about 57.1% argon). Curve 315 illustrates the temperature dependent relative change in frequency ($\Delta f/f$) for a vapor cell containing a buffer gas having about 0.5% more argon (that is, about 57.7% argon). It may be observed that curve 305 has a peak at about 90° C., curve 310 has a peak at about 92.5° C., and curve 315 has a peak at about 88° C.

FIG. 4B presents an expanded view (300a) of graph 300 at around 90° C. Specifically, graph 300a illustrates the behaviors of curves 305, 310, and 315 in the temperature range of about 89.9° C. to about 90.1° C. It may be observed that curve 305 is effectively flat over the temperature range of 89.9° C. to about 90.1° C. However, curve 310 linearly increases over that temperature range, and curve 315 linearly decreases over that temperature range. Thus, FIGS. 4A,B illustrate that the temperature dependent relative change in frequency ($\Delta f/f$) can vary even with slight changes in buffer gas composition. It may be understood that curves 305, 310, and 315 are drawn for illustrative purposes and that the values of the buffer gas composition discussed with respect to each curve are exemplary values only. It may be understood that the temperature ranges depicted in FIGS. 4A and 4B are for illustrative purposes only. Depending on the alkali metal system and the buffer gasses used, different temperature ranges may be observed.

Figure 5A:
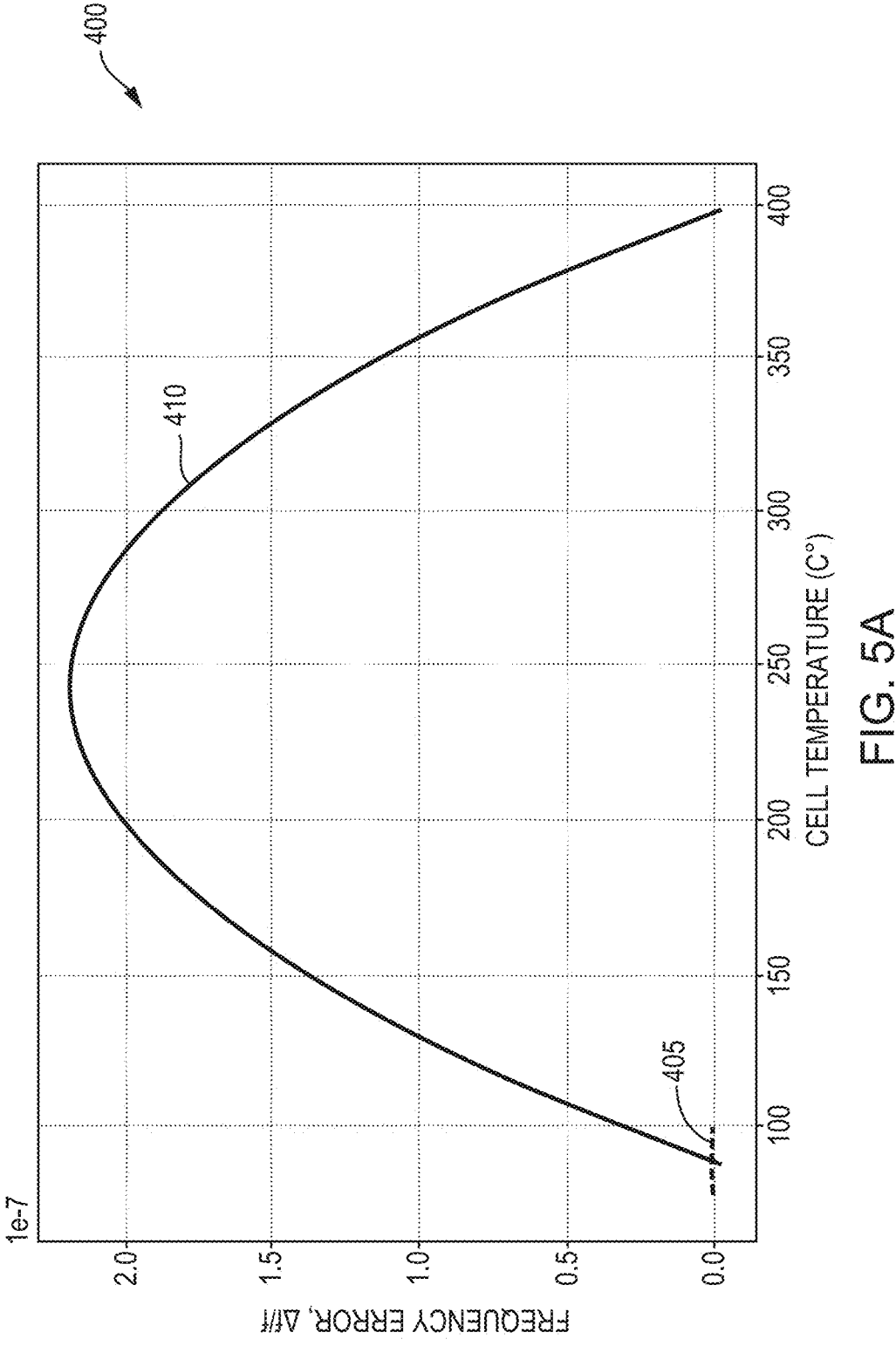
FIG. 5A is a graph of one aspect of frequency error versus vapor cell temperature for a first vapor cell and a second vapor cell comprising different vapor compositions according to the present disclosure.

FIG. 5A illustrates a graph 400 of the temperature dependent relative change in frequency ($\Delta f/f$) versus temperature for two vapor cells (corresponding to vapor cells 120a and 120b in FIGS. 1 and 2) over a wide temperature range (from about 100° C. to about 400° C.). Curve 405 illustrates the temperature dependent relative change in frequency ($\Delta f/f$) for a first vapor cell (the "timing vapor cell") containing a buffer gas having about 57.4% argon (the rest being nitrogen) at a pressure of about 50 Torr. Curve 410 illustrates the temperature dependent relative change in frequency ($\Delta f/f$) for a second vapor cell (the "reference vapor cell") containing a buffer gas having nitrogen only at a pressure of about 50 Torr. The relative change in frequency ($\Delta f/f$) axis (y-axis in graph 400) is scaled to permit viewing of the complete curve 410 of the reference vapor cell (from about 0 to about $2.5 \times 10^{-7}$). On this scale, curve 405 of the timing vapor cell is very small compared to curve 410. Further, in the range of values illustrated in graph 400, curve 410 illustrates generally an inverted parabolic shape, having a peak in the temperature dependent relative change in frequency ($\Delta f/f$) of about $2.3 \times 10^{-7}$ near about 250° C.

Figure 5B:
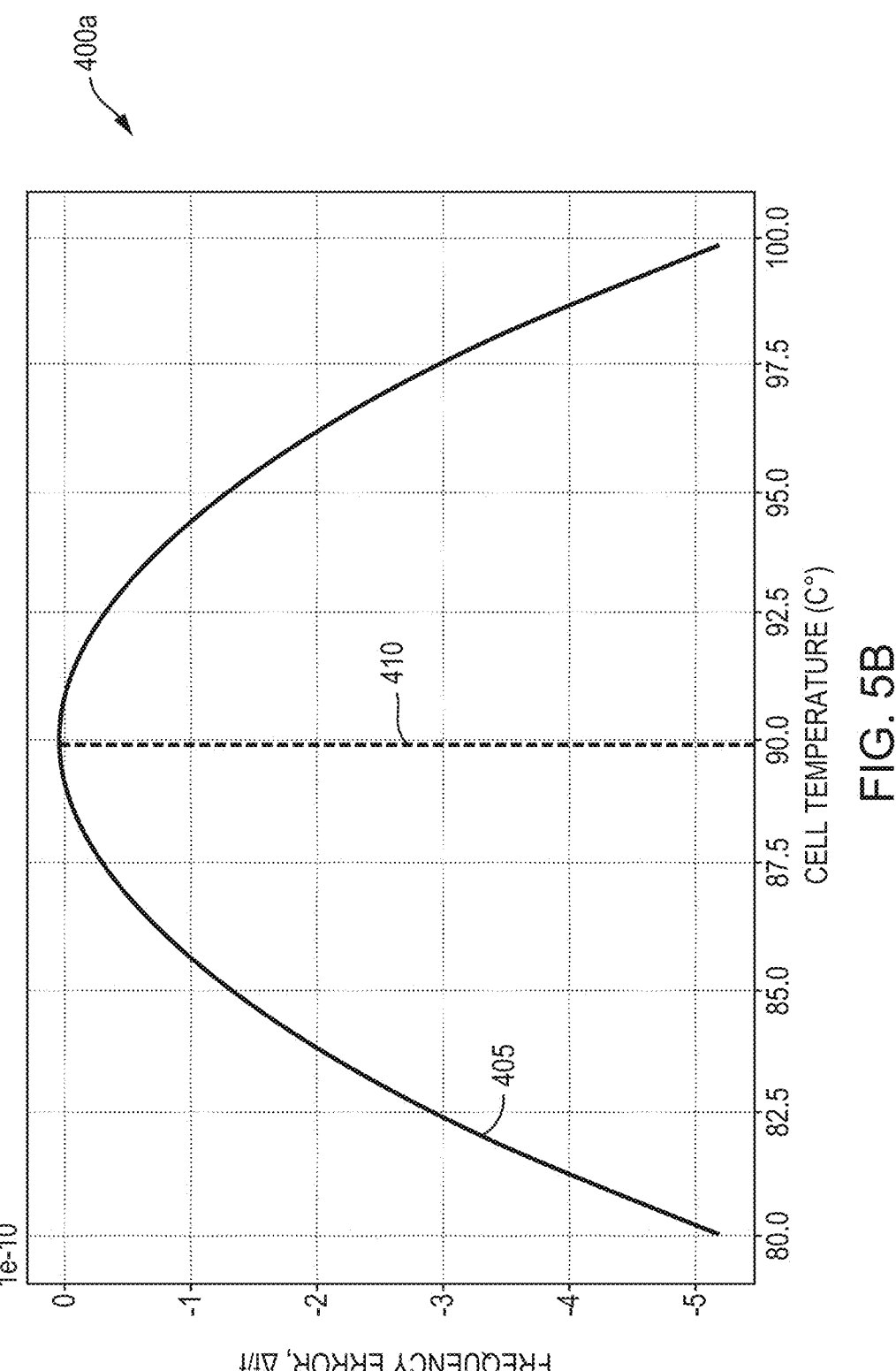
FIG. 5B is an expanded graph of a portion of the graph illustrated in FIG. 5A according to the present disclosure.

FIG. 5B presents an expanded view (400a) of graph 400 at around 90° C. Additionally, the relative change in frequency ($\Delta f/f$) axis (y-axis in graph 400a) is scaled to permit viewing of the complete curve 405 of the timing vapor cell (from about $-5 \times 10^{-10}$ to about 0) in the temperature range of about 80.0° C. to about 100.0° C. It may be observed that curve 405 presents an approximately inverted parabolic response with a peak at about 90.0° C., having a peak relative change in frequency ($\Delta f/f$) of about 0. However, in the range of values depicted in graph 400a, only a monotonically increasing portion of curve 410 is observed, having a very steeply increasing slope. One can observe little change in the temperature dependent relative change in frequency ($\Delta f/f$) of curve 405 around 90.0° C. (for example between 89.8° C. and 90.2° C.). However, over the same temperature range, the temperature dependent relative change in frequency ($\Delta f/f$) of curve 410 may change significantly (for example, by about $5 \times 10^{-10}$). Again, it may be understood that curves 405 and 410 are drawn for illustrative purposes and that the values of the buffer gas composition discussed with respect to each curve are exemplary values only.

Thus, determining the difference in resonance frequencies between the timing vapor cell and the reference vapor cell may be an accurate means to detect the actual temperature of the contents of the timing vapor cell. By determining the temperature of the contents of the timing vapor cell, a temperature dependent frequency correction may be applied to the standardized output waveform of the atomic frequency standard, thereby improving its accuracy.

Figure 6:
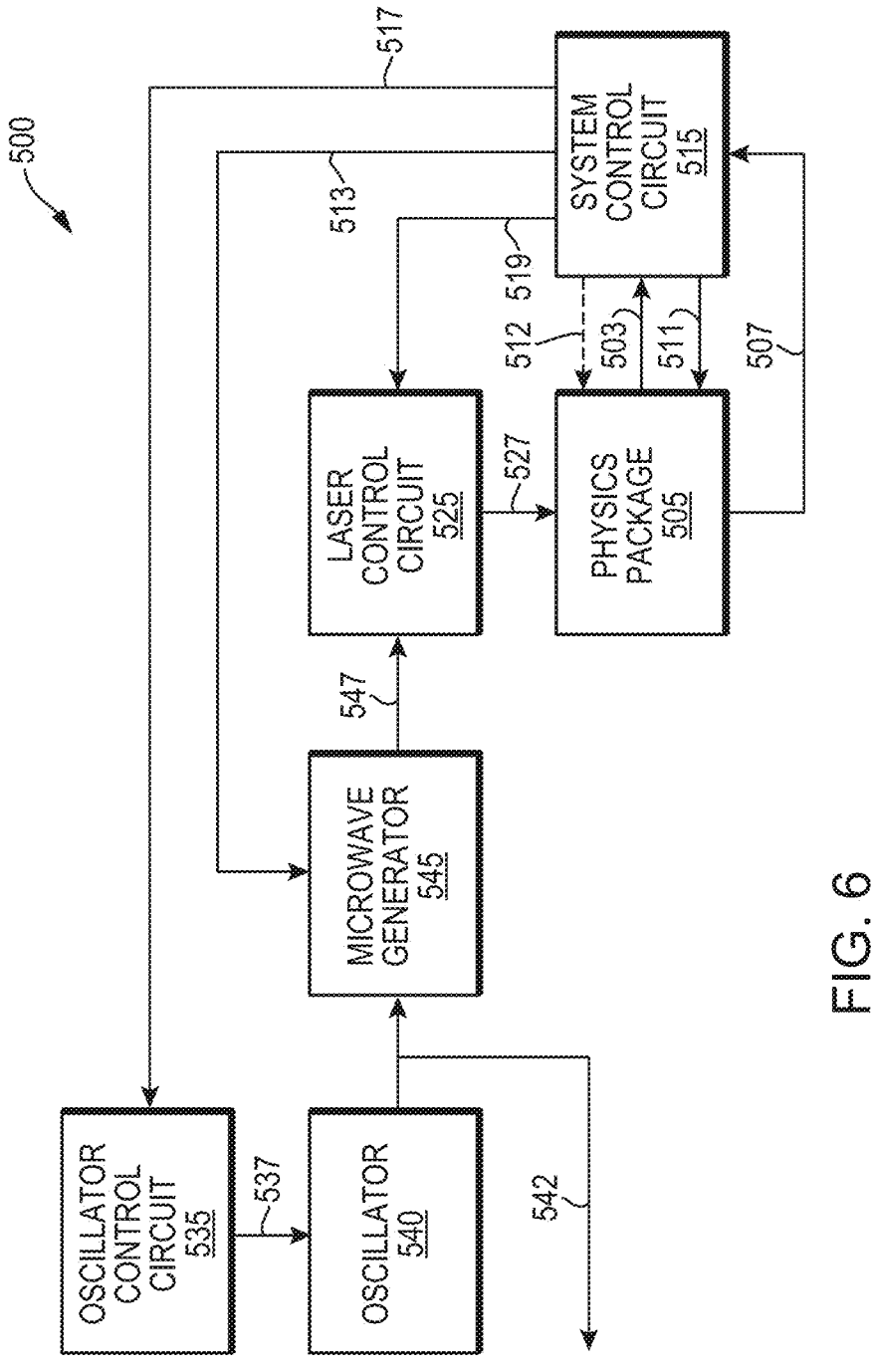
FIG. 6 is a block diagram of one aspect of a system for compensating temperature variability in a physics package according to the present disclosure.

FIG. 6 illustrates a system 500 for temperature compensation of a physics package. The system 500 includes a physics package 505 comprising optical assembly 100 as depicted in FIG. 2. In one aspect, physics package 505 may include two vapor cells similar to 120a,b in FIG. 2. In some aspects, the two vapor cells may be in thermal communication with each other. The vapor cells may be heated by a heating element (not shown) disposed within the physics package 505. One or more temperature sensors (see 240a,b in FIG. 3A, for example) may detect a temperature of the vapor cells. Some non-limiting examples of temperature sensors 240a,b may include thermocouples, resistance based temperature detectors, thermistors, and semiconductor based integrated circuits. The temperature data 507 from the temperature sensors may be provided to an input to a temperature control circuit. The heating elements within physics package 505 may be controlled by a thermal control signal 511 from the temperature control circuit, thereby controlling a temperature of the elements within physics package 505. For example, the temperature control circuit may receive temperature data 507 from the temperature sensors, compare those data to a pre-defined temperature value, and then send thermal control signal 511 to the heating element. As a non-limiting example, if temperature data 507 are less than the pre-defined temperature value, the temperature control circuit may increase a current to the heating element to increase the temperature within physics package 505. Alternatively, if temperature data 507 are greater than the pre-defined temperature value, the temperature control circuit may decrease or turn off a current to the heating element to permit the temperature within physics package 505 to decrease. In some aspects, the temperature control circuit may be a stand-alone circuit. In other aspects, the temperature control circuit may be a component of a system control circuit 515.

As discussed previously, light transmitted through the two vapor cells may be detected by photo-detector 130, for example by first photo-sensor 130a and by second photo-sensor 130b. Photo-detector data 503 from may be transmitted to system control circuit 515. If two separate photo-sensors 130a,b are used, system control circuit 515 may alternately process the data from first photo-sensor 130a and from second photo-sensor 130b.

Light 210 emitted by laser 110 (see for example at FIGS. 2 and 3A) may be modulated as disclosed above. Laser 110 may receive a modulation signal 527 from a laser control circuit 525. Laser control circuit 525 may receive a first laser control signal 519 from the system control circuit 515. First laser control signal 519 may include a DC component and an AC component. The DC component may determine an overall laser output power. The AC component may include a small-amplitude AC signal at a low frequency, for example at about 2 KHz. Because the optical signal corresponding to the extremum of the laser output transmittance (see 50 at FIG. 1H) may be small, the AC component is added to assist system control circuit 515 in detecting the extremum transmittance value using well-known frequency locking techniques. Laser control circuit 525 may also receive a second laser control signal 547 from a microwave generator 545, as disclosed below.

System 500 may also include an oscillator 540 and an oscillator control circuit 535. Oscillator control circuit 535 may transmit an oscillator control signal 537 to oscillator 540, thereby controlling an output signal 542 of oscillator 540. Output signal 542 may have an output signal frequency used by an external device as a stabilized frequency for time-keeping purposes, for example. Oscillator 540 may be any type of a controllable oscillator, for example a quartz crystal oscillator. In some examples, oscillator control circuit 535 may include a voltage-controlled oscillator (VCO). Oscillator control signal 537 may include an AC component to drive oscillator 540. In some non-limiting examples, oscillator 540 and oscillator control circuit 535 may be separate devices. In other non-limiting examples, oscillator 540 and oscillator control circuit 535 may be packaged together into a single device. Oscillator control circuit 535 may receive an oscillator control circuit control signal 517 from system control circuit 515. In one non-limiting example, oscillator control circuit control signal 517 may include a voltage to control a frequency output of a VCO disposed within oscillator control circuit 535. In this manner, the frequency of output signal 542 may be varied under the control of system control circuit 515. In some aspects, the frequency of output signal 542 may be about 10 MHz.

As disclosed above, light 210 emitted by laser 110 may be modulated to produce sidebands having frequencies capable of promoting the free alkali metal electron to an excited state from one of two ground states. The difference between the frequencies of the sidebands $\Omega_-$ and $\Omega_+$ may be about 6.8 GHz, corresponding to the hyperfine splitting frequency $\omega_0$. Therefore, light 210 emitted by laser 110 may be modulated by a signal having a frequency about 3.4 GHz (one half of $\omega_0$). Laser light 210 may be modulated by a microwave signal at the corresponding frequency of about 3.4 GHz. Thus, laser control circuit 525 may receive a second laser control signal 547 from a microwave generator 545 to generate the appropriate sidebands in light 210 emitted by laser 110.

Microwave generator 545 may receive the output signal 542 from oscillator 540. Microwave generator 545 may also receive a microwave generator control signal 513 from system control circuit 515. In one example, microwave generator 545 may include a tank circuit. In another example, microwave generator 545 may include a phase-locked loop to lock a phase of second laser control signal 547 to a phase of output signal 542. In some aspects, a frequency of second laser control signal 547 may be generated by a frequency multiplication of output signal 542 by microwave generator control signal 513 received from system control circuit 515. In some aspects, microwave generator control signal 513 may be a digital signal provided in either a parallel digital format or a serial stream format. In another aspect, microwave generator control signal 513 may be an analog signal, for example a DC signal.

System 500 may operate as follows.

Initially, a predetermined value of oscillator control circuit control signal 517 may be applied to oscillator control circuit 535 by system control circuit 515. Similarly, a predetermined frequency multiplier signal (microwave generator control signal 513) may be applied to microwave generator 545. This results in second laser control signal 547 having an initial modulation frequency for laser 110 based on output signal 542 multiplied by microwave generator control signal 513. System control circuit 515 may receive photo-detector data 503 from first photo-sensor 130a representing the transmittance of light through first vapor cell 120s. System control circuit 515 may then sweep the value of oscillator control circuit control signal 517. Because output signal 542 is multiplied by the frequency multiplier signal (microwave generator control signal 513) at microwave generator 545, second laser control signal 547 (corresponding to the laser modulation frequency) is also swept across a modulation frequency range. When system control circuit 515 detects an extremum in transmitted light through first vapor cell 120a, oscillator control circuit control signal 517 represent a value corresponding to the laser sideband frequency resulting in the extremum. Over time, may continue to monitor photo-detector data 503 from first photo-sensor 130a representing the transmittance of light through first vapor cell 120a. If output signal 542 deviates from its normative value (for example, at 10 MHz) due, for example, to temperature effects on the components of oscillator control circuit 535 and/or oscillator 540, system control circuit 515 may change a value of oscillator control circuit control signal 517 until the extremum in photo-detector data 503 is re-detected. In this manner, output signal 542 may locked to the hyperfine splitting frequency $\omega$ of the alkali metal in first vapor cell 120a. This mode of operation of system 500 may be considered an output signal frequency lock mode.

Figure 7A:
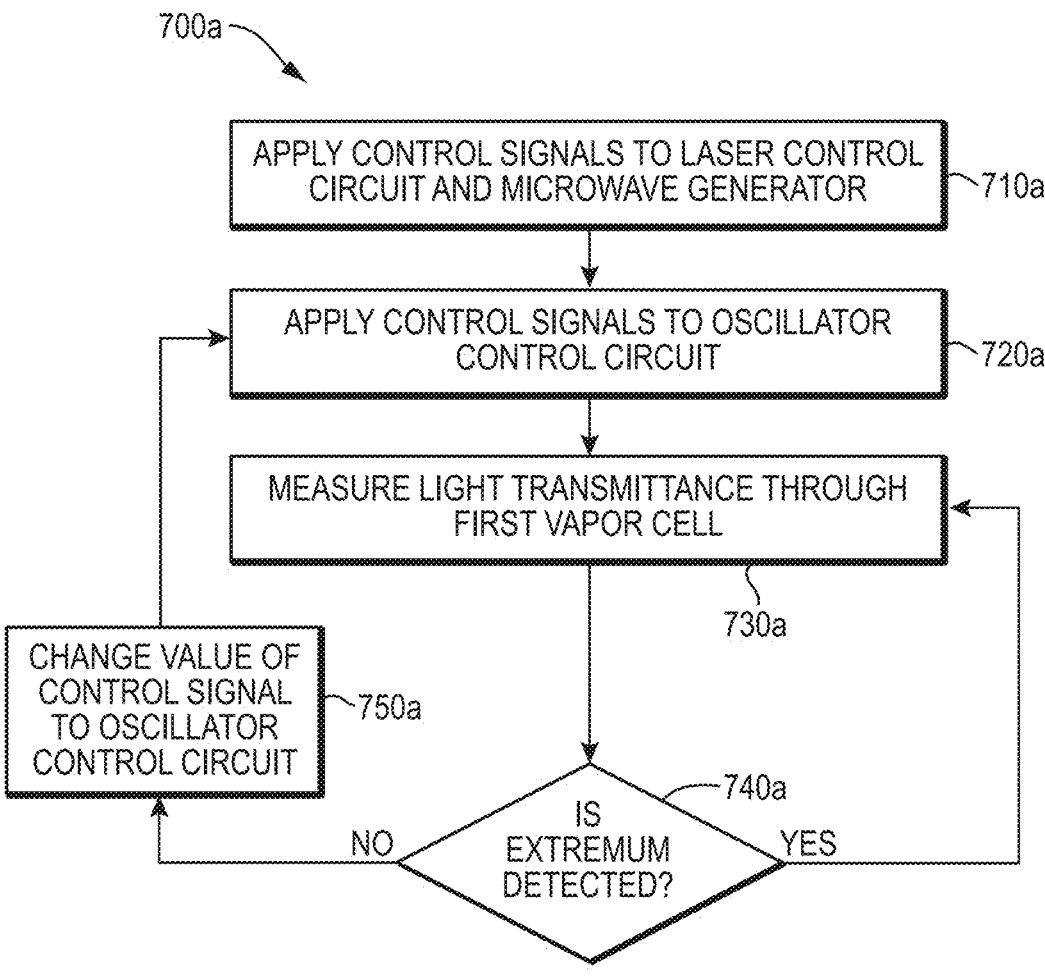
FIG. 7A is a flow chart of one aspect of a system for compensating temperature variability in a physics package operating in an output signal frequency lock mode.

FIG. 7A illustrates in brief a flow diagram 700a of the operation of system 500 operating in output signal frequency lock mode. At step 710a, control circuit 515 applies laser control circuit control signal 519 to laser control circuit 525. Also at step 710a, control circuit 515 applies microwave generator control signal 513 to microwave generator 545. At step 720s, control circuit 515 applies oscillator control circuit control signal 517 to oscillator control circuit 535. At step 730a, control circuit 515 receives photo-detector data 503 from first photo-sensor 130a representing the transmittance of light through first vapor cell 120a. At step 740a, control circuit 515 determines if the transmittance extremum is detected. If the extremum from photo-detector data 503 is detected, control circuit 515 continues to monitor the light transmitted through first vapor cell 120a (returning to step 730a). If the extremum from photo-detector data 503 is not detected, control circuit 515 changes a value of oscillator control circuit control signal 517 (step 750a) and applies this new value to oscillator control circuit 535 (returning to step 720a).

As noted above, the hyperfine splitting frequency $\omega_0$ may be temperature dependent. As $\omega_0$ changes with temperature, $\omega_1$ and $\omega_2$ may also change with temperature. As a result, the frequencies of the sidebands $\Omega_-$ and $\Omega_+$ from the laser light modulation may diverge from $\omega_1$ and $\omega_2$ due to the energy level shift in hyperfine splitting frequency $\omega_0$. Because first buffer gas in first vapor cell 120a may be relatively insensitive to temperature at the extremum, photo-detector data 503 may not determine that a temperature shift in $\omega_0$ has occurred. Compensation for the temperature shift in $\omega_0$ may be detected through measurements of laser light transmission through second vapor cell 120b.

As disclosed above with respect to FIGS. 4A,B and 5A,B, second vapor cell 120b may include a second buffer gas having a greater tempco than the first buffer gas in first vapor cell 120a. Thus, light transmitted through second vapor cell 120b may be more sensitive to temperature dependent changes in $\omega_0$ than light transmitted through first vapor cell 120a (having a smaller tempco than the second buffer gas). Because it is desirable to fix output signal 542 at a nominal value (for example at 10 MHz), the multiplier value of microwave generator control signal 513 is effectively determined by $\omega_0$. Since photo-detector data 503 derived from light transmitted through first vapor cell 120a via first photo-sensor 130a may not be able to resolve a temperature induced change in $\omega_0$, system control circuit 515 may rely on photo-detector data 503 derived from light transmitted through second vapor cell 120b via second photo-sensor 130b which is more sensitive to temperature fluctuations in $\omega_0$.

Returning now to FIG. 6, in order to compensate for temperature variations in $\omega_0$, system 500 may operate in the following temperature compensation mode. In this mode, output signal 542 may be considered to have a frequency at a nominal value (for example at 10 MHz). System control circuit 515 may receive photodetector data 503 from second photo-sensor 130b representing the transmittance value of laser light 210 through second vapor cell 120b. System control circuit 515 may then scan the multiplier value applied to microwave generator 545 through microwave generator control signal 513 until the supremum is detected in photodetector data 503. After the temperature compensation step occurs, system control circuit 515 may return to output signal frequency lock mode as before.

Figure 7B:
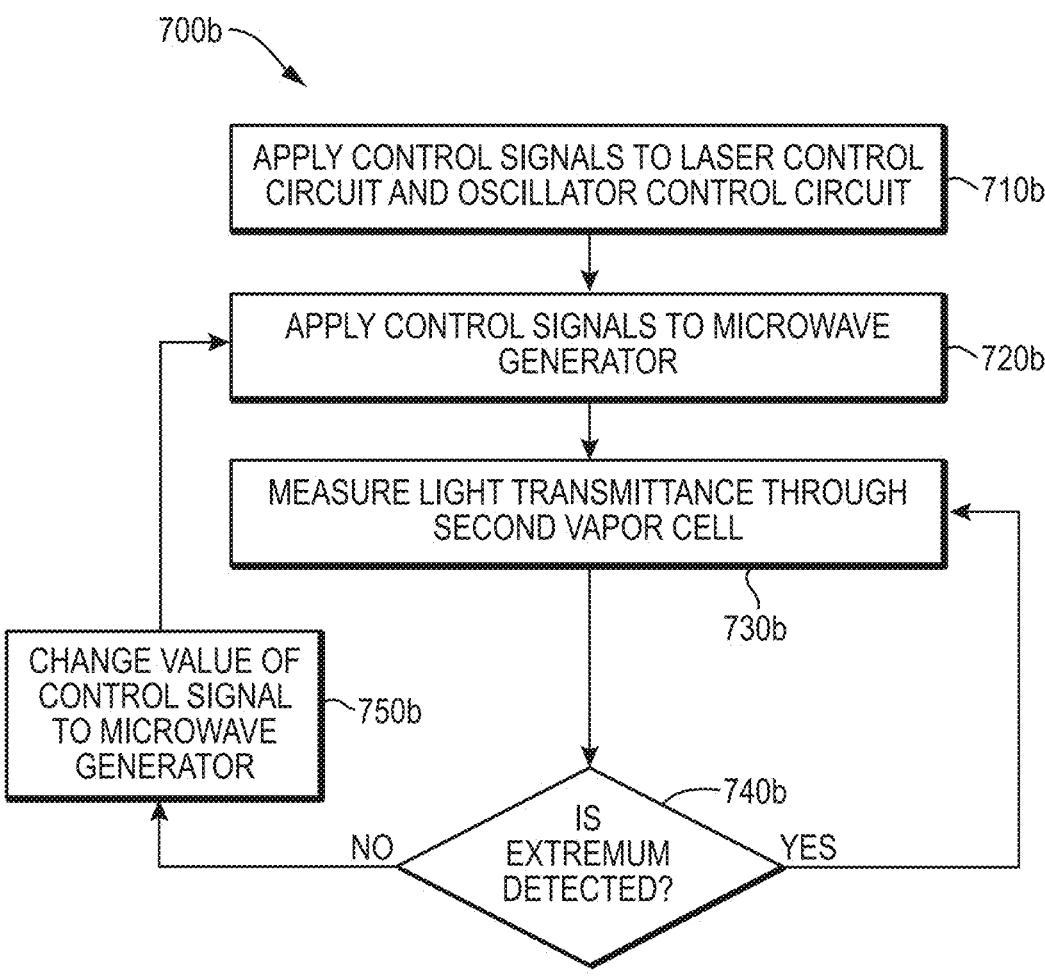
FIG. 7B is a flow chart of a second aspect of a system for compensating temperature variability in a physics package operating in a temperature compensation mode.

FIG. 7B illustrates in brief a flow diagram 700b of the operation of system 500 operating in temperature compensation mode. At step 710b, control circuit 515 applies laser control circuit control signal 519 to laser control circuit 525. Also at step 710a, control circuit 515 applies oscillator control circuit control signal 517 to oscillator control circuit 535. At step 720b, control circuit 515 applies microwave generator control signal 513 to microwave generator 545. At step 730b, control circuit 515 receives photo-detector data 503 from second photo-sensor 130b representing the transmittance of light through second vapor cell 120b. At step 740a, control circuit 515 determines if the transmittance extremum is detected. If the extremum from photo-detector data 503 is detected, control circuit 515 continues to monitor the light transmitted through second vapor cell 120b (returning to step 730b). If the extremum from photo-detector data 503 is not detected, control circuit 515 changes a value of the microwave generator control signal 513 (step 750*b*) and applies this new value to microwave generator 545 (returning to step 720*b*).

In some aspects, system control circuit 515 may include electronic circuit components to receive and condition photodetector data 503. Such circuit components may include, without limitation, any type of filter circuits and amplifier circuit including discrete elements and integrated circuits such as amplifier circuits. Such circuits may also include components related to frequency locking techniques for isolating the signal received from the laser. Frequency locking components may include any number of components including an oscillator, filter circuits, and amplifiers. Control circuit 515 may also include components for generating and sweeping a signal value of oscillator control circuit control signal 517. Control circuit 515 may further include components for generating and sweeping a signal value of the microwave generator control signal 513. Non-limiting examples of such components may include analog or digital circuit components. Analog components may include discrete or integrated circuit components. Digital components may include a processor and a memory unit configured to store instructions that, when executed by the processor, may cause the processor to execute steps related to operations in the output signal frequency lock mode or operations in the temperature compensation mode. The processor may be a general computing processor, a microprocessor, or a specialized processor such as a digital signal processor. System control circuit 515 may also include components required to transmit the various control signals to their respective destinations.

In some aspects, system control circuit 515 may receive photo-detector data 503 from first photo-sensor 130*a* over a first physical signal line, and photo-detector data 503 from second photo-sensor 130*b* over a second physical signal line. In this aspect, system control circuit 515 may have an internal switch to read photo-detector data 503 from first photo-sensor 130*a* during output signal frequency lock mode and from second photo-sensor 130*b* during temperature compensation mode. In alternative aspects, system control circuit 515 may receive photo-detector data 503 from first photo-sensor 130*a* and photo-detector data 503 from second photo-sensor 130*b* over the same physical signal line. In this aspect, system control circuit 515 may generate a photo-detector control signal 512 to control which of first photo-sensor 130*a* or second photo-sensor 130*b* may transmit photo-detector data 503 over the common physical signal line.

In general, system control circuit 515 may operate in output signal frequency lock mode more than in temperature control mode. In some examples, system control circuit 515 may operate in output signal frequency lock mode during 90-95% of the time. Thus, system control circuit 515 may operate in temperature control mode for 10-5% of the time. For example, over a period of about 400 msec to about 500 msec, the system control circuit 515 may operate in temperature control mode for about 10 ms to about 50 ms, with the system control circuit 515 operating in output signal frequency lock mode during the remainder of that period (between about 350 msec to about 490 msec).

Having shown and described various aspects of the present disclosure, further adaptations of the methods and systems described herein may be accomplished by appropriate modifications by one of ordinary skill in the art without departing from the scope of the present disclosure. Several of such potential modifications have been mentioned, and others will be apparent to those skilled in the art. For instance, the examples, aspects, geometrics, materials, dimensions, ratios, steps, and the like discussed above are illustrative and are not required. Accordingly, the scope of the present disclosure should be considered in terms of the following claims and is understood not to be limited to the details of structure and operation shown and described in the specification and drawings.

While various details have been set forth in the foregoing description, it will be appreciated that the various aspects of the system and method for using sleep enhancement during sleep may be practiced without these specific details. One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Further, while several forms have been illustrated and described, it is not the intention of the applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

For conciseness and clarity of disclosure, selected aspects of the foregoing disclosure have been shown in block diagram form rather than in detail. Some portions of the detailed descriptions provided herein may be presented in terms of instructions that operate on data that is stored in a computer memory. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities.

Unless specifically stated otherwise as apparent from the foregoing disclosure, it is appreciated that, throughout the foregoing disclosure, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one form, several portions of the subject matter described herein may be implemented via an application specific integrated circuits (ASIC), a field programmable gate array (FPGA), a digital signal processor (DSP), or other integrated formats. However, those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative form of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In some instances, one or more elements may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other, but yet still co-operate or interact with each other. It is to be understood that depicted architectures of different components contained within, or connected with, different other components are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated also can be viewed as being "operably connected," or "operably coupled," to each other to achieve the desired functionality, and any two components capable of being so associated also can be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In other instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present disclosure have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "one form," or "a form" means that a particular feature, structure, or characteristic described in connection with the aspect is included in at least one aspect. Thus, appearances of the phrases "in one aspect," "in an aspect," "in one form," or "in an form" in various places throughout the specification are not necessarily all referring to the same aspect. Furthermore, the particular features, structures or characteristics may be combined in any suitable manner in one or more aspects.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory).

A sale of a system or method may likewise occur in a territory even if components of the system or method are located and/or used outside the territory. Further, implementation of at least part of a system for performing a method in one territory does not preclude use of the system in another territory.

All of the above-mentioned U.S. patents, U.S. patent application publications, U.S. patent applications, foreign patents, foreign patent applications, non-patent publications referred to in this specification and/or listed in any Application Data Sheet, or any other disclosure material are incorporated herein by reference, to the extent not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

Various Embodiments are Described in the Following Numbered Examples

Example 1. A thermally compensated physics package may include a laser, a first vapor cell to receive a first portion of an output of the laser, a second vapor cell to receive a second portion of the output of the laser, and a photo-detector. The first vapor cell may include an alkali metal vapor and a first buffer gas, and the second vapor cell may include the alkali metal vapor and a second buffer gas. A composition of the first buffer gas may differ from a composition of the second buffer gas. The photo-detector may detect a first optical transmittance of a first portion of the output of the laser transmitted through the first vapor cell, and detect a second optical transmittance of a second portion of the output of the laser transmitted through the second vapor cell.

Example 2. The thermally compensated physics package of Example 1, in which the first buffer gas has a temperature dependent relative change in frequency that is less than a temperature dependent relative change in frequency of the second buffer gas.

Example 3. The thermally compensated physics package of Example 2, in which the first buffer gas includes a mixture of a noble gas and a first molecular gas, and the second buffer gas includes a second molecular gas.

Example 4. The thermally compensated physics package of Example 3, in which the noble gas is argon.

Example 5. The thermally compensated physics package of Examples 3 or 4, in which the first molecular gas and the second molecular gas are nitrogen.

Example 6. The thermally compensated physics package of any one or more of Examples 1-5, further including a beam splitter.

Example 7. The thermally compensated physics package of Example 6, in which the photo-detector includes a first photo-sensor and a second photo-sensor.

Example 8. The thermally compensated physics package of Example 7, in which the first photo-sensor is to detect the first optical transmittance and the second photo-sensor is to detect the second optical transmittance.

Example 9. The thermally compensated physics package of any one or more of Examples 1-8, in which the alkali metal vapor includes rubidium vapor.

Example 10. A system may include a physics package, an output frequency generator, a microwave generator, a laser modulation circuit, and a control circuit including a processor and a memory unit. The physics package may include a laser, a first vapor cell to receive a first portion of an output of the laser, a second vapor cell to receive a second portion of the output of the laser, and a photo-detector. The first vapor cell may include an alkali metal vapor and a first buffer gas, and the second vapor cell may include the alkali metal vapor and a second buffer gas. A composition of the first buffer gas may differ from a composition of the second buffer gas. The photo-detector may detect a first optical transmittance of a first portion of the output of the laser transmitted through the first vapor cell, and detect a second optical transmittance of a second portion of the output of the laser transmitted through the second vapor cell. The memory unit of the control circuit may include instructions that, when executed by the processor, cause the processor to modulate, via the laser modulation circuit, a characteristic of the output of the laser; and control an output of the output frequency generator.

Example 11. The system of Example 10, in which the physics package further may include a heating element, a temperature sensor to receive temperature data from the physics package, and a temperature control circuit to control a temperature of the heating element based on the temperature data.

Example 12. The system of any one or more of Examples 10 and 11, in which the microwave generator is configured to receive an output of the output frequency generator, and the laser modulation circuit is configured to receive an output of the microwave generator.

Example 13. The system of any one or more of Examples 10-12, in which the memory unit includes instructions that, when executed by the processor, further cause the processor to control a frequency of the output frequency generator based at least in part on a first extremum of a value of the first optical transmittance detected by the photo-detector, and control a frequency of microwave generator based at least in part on a second extremum of a value of the second optical transmittance detected by the photo-detector.

Example 14. A method to thermally compensate a physics package may include modulating an output of a laser, measuring a value of a first light transmittance of a first portion of the output of the laser transmitted through a first vapor cell, in which the first vapor cell includes an alkali metal vapor and a first buffer gas, and measuring a value of a second light transmittance of a second portion of the output of the laser transmitted through a second vapor cell, in which the second vapor cell includes the alkali metal vapor and a second buffer gas. The first buffer gas may have a temperature dependent relative change in frequency that is less than a temperature dependent relative change in frequency of the second buffer gas.

Example 15. The method to thermally compensate the physics package of Example 14, further including modulating a characteristic of the output of the laser by a first modulation signal corresponding to a value of a first transmittance extremum of the first portion of the output of the laser transmitted through the first vapor cell, and modulating the characteristic of the output of the laser by a second modulation signal corresponding to a value of a second transmittance extremum of the second portion of the output of the laser transmitted through the second vapor cell.

Example 16. The method to thermally compensate the physics package of any one or more of Examples 14 and 15, further including placing the first vapor cell in thermal communication with the second vapor cell.

Example 17. The method to thermally compensate the physics package of Example 16, further including controlling a temperature of the first vapor cell and of the second vapor cell.

Example 18. The method to thermally compensate the physics package of any one or more of Examples 14-17, further including measuring the first light transmittance over a first period of time and measuring the second light transmittance over a second period of time, in which the first period of time is greater than the second period of time.

What is claimed is:

1. A thermally compensated physics package comprising:
a laser;
a first vapor cell to receive a first portion of an output of the laser, wherein the first vapor cell comprises an alkali metal vapor and a first buffer gas;
a second vapor cell to receive a second portion of the output of the laser, wherein the second vapor cell comprise the alkali metal vapor and a second buffer gas,
wherein a composition of the first buffer gas differs from a composition of the second buffer gas; and
a photo-detector to detect a first optical transmittance of a first portion of the output of the laser transmitted through the first vapor cell, and to detect a second optical transmittance of a second portion of the output of the laser transmitted through the second vapor cell.

2. The thermally compensated physics package of claim 1, wherein the first buffer gas has a temperature dependent relative change in frequency that is less than a temperature dependent relative change in frequency of the second buffer gas.

3. The thermally compensated physics package of claim 2, wherein the first buffer gas comprises a mixture of a noble gas and a first molecular gas, and the second buffer gas comprises a second molecular gas.

4. The thermally compensated physics package of claim 3, wherein the noble gas comprises argon.

5. The thermally compensated physics package of claim 3, wherein the first molecular gas and the second molecular gas comprise nitrogen.

6. The thermally compensated physics package of claim 1, further comprising a beam splitter.

7. The thermally compensated physics package of claim 6, wherein the photo-detector comprises a first photo-sensor and a second photo-sensor.

8. The thermally compensated physics package of claim 7, wherein the first photo-sensor is to detect the first optical transmittance and the second photo-sensor is to detect the second optical transmittance.

9. The thermally compensated physics package of claim 1, wherein the alkali metal vapor comprises rubidium vapor.

10. A system comprising:
a physics package comprising:
a laser;
a first vapor cell to receive a first portion of an output of the laser, wherein the first vapor cell comprises an alkali metal vapor and a first buffer gas;
a second vapor cell to receive a second portion of the output of the laser, wherein the second vapor cell comprises the alkali metal vapor and a second buffer gas, wherein a composition of the first buffer gas differs from a composition of the second buffer gas; and
a photo-detector to detect a first optical transmittance of a first portion of the output of the laser transmitted through the first vapor cell and to detect a second optical transmittance of a second portion of the output of the laser transmitted through the second vapor cell;
an output frequency generator;
a microwave generator;
a laser modulation circuit; and
a control circuit comprising a processor and a memory unit, wherein the memory unit comprises instructions that, when executed by the processor, cause the processor to:
modulate, via the laser modulation circuit, a characteristic of the output of the laser; and
control an output of the output frequency generator.

11. The system of claim 10, wherein the physics package further comprises:
a heating element;
a temperature sensor to receive temperature data from the physics package; and
a temperature control circuit to control a temperature of the heating element based on the temperature data.

12. The system of claim 10, wherein the microwave generator is configured to receive an output of the output frequency generator, and the laser modulation circuit is configured to receive an output of the microwave generator.

13. The system of claim 10, wherein the memory unit comprises instructions that, when executed by the processor, further cause the processor to:
control a frequency of the output frequency generator based at least in part on a first extremum of a value of the first optical transmittance detected by the photo-detector; and
control a frequency of microwave generator based at least in part on a second extremum of a value of the second optical transmittance detected by the photo-detector.

14. A method to thermally compensate a physics package, the method comprising:
modulating an output of a laser;
measuring a value of a first light transmittance of a first portion of the output of the laser transmitted through a first vapor cell, wherein the first vapor cell comprises an alkali metal vapor and a first buffer gas; and
measuring a value of a second light transmittance of a second portion of the output of the laser transmitted through a second vapor cell, wherein the second vapor cell comprises the alkali metal vapor and a second buffer gas,
wherein the first buffer gas has a temperature dependent relative change in frequency that is less than a temperature dependent relative change in frequency of the second buffer gas.

15. The method to thermally compensate the physics package of claim 14, further comprising:
modulating a characteristic of the output of the laser by a first modulation signal corresponding to a value of a first transmittance extremum of the first portion of the output of the laser transmitted through the first vapor cell; and
modulating the characteristic of the output of the laser by a second modulation signal corresponding to a value of a second transmittance extremum of the second portion of the output of the laser transmitted through the second vapor cell.

16. The method to thermally compensate the physics package of claim 14, further comprising placing the first vapor cell in thermal communication with the second vapor cell.

17. The method to thermally compensate the physics package of claim 16, further comprising controlling a temperature of the first vapor cell and of the second vapor cell.

18. The method to thermally compensate the physics package of claim 14, further comprising:
measuring the first light transmittance over a first period of time; and
measuring the second light transmittance over a second period of time,
wherein the first period of time is greater than the second period of time.

* * * * *